(12) United States Patent
Zhang

(10) Patent No.: US 12,520,485 B2
(45) Date of Patent: Jan. 6, 2026

(54) THREE-DIMENSIONAL MEMORY DEVICES AND FABRICATING METHODS THEREOF

(71) Applicant: YANGTZE MEMORY TECHNOLOGIES CO., LTD., Wuhan (CN)

(72) Inventor: Kun Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 370 days.

(21) Appl. No.: 18/081,609

(22) Filed: Dec. 14, 2022

(65) Prior Publication Data

US 2024/0172429 A1 May 23, 2024

(30) Foreign Application Priority Data

Nov. 23, 2022 (CN) .......................... 202211477494.3

(51) Int. Cl.
 *H10B 41/20* (2023.01)
 *H10B 43/20* (2023.01)
(52) U.S. Cl.
 CPC ............. *H10B 41/20* (2023.02); *H10B 43/20* (2023.02)

(58) Field of Classification Search
 CPC ........ H10B 41/20; H10B 43/20; H10B 41/10; H10B 41/50; H10B 43/10; H10B 41/27; H10B 43/27; H10B 43/50
 See application file for complete search history.

(56) References Cited

U.S. PATENT DOCUMENTS

| 10,283,493 B1 * | 5/2019 | Nishida ............... H01L 25/0657 |
| 11,380,629 B2 * | 7/2022 | Zhang ...................... H01L 25/50 |
| 12,004,348 B2 * | 6/2024 | Mizutani ............... H10B 43/10 |
| 2009/0168482 A1 * | 7/2009 | Park ....................... H10B 41/41 365/103 |
| 2022/0005820 A1 * | 1/2022 | Kim ...................... H10B 41/40 |

* cited by examiner

*Primary Examiner* — Allison Bernstein
(74) *Attorney, Agent, or Firm* — BAYES PLLC

(57) ABSTRACT

Three-dimensional (3D) memory devices and fabricating methods thereof are disclosed. In certain aspects, a disclosed 3D memory device can comprise a first semiconductor structure including a core region, a staircase region, and a periphery region, and a second semiconductor structure including a second periphery circuit on a substrate. The first semiconductor structure can include a memory stack on an activated semiconductor layer in the core region, a staircase structure on a supplemental semiconductor layer in the staircase region, and a first periphery circuit on a doped semiconductor film in the periphery region. The second semiconductor structure is connected with the first semiconductor structure.

20 Claims, 23 Drawing Sheets

THREE-DIMENSIONAL MEMORY DEVICES AND FABRICATING METHODS THEREOF

CROSS-REFERENCE TO RELATED APPLICATIONS

This application claims the benefit of priority to Chinese Application No. 202211477494.3, filed Nov. 23, 2022, which is incorporated herein by reference in its entirety.

TECHNICAL FIELD

The present disclosure generally relates to the field of semiconductor technology, and more particularly, to a three-dimensional (3D) memory device and a fabricating method thereof.

BACKGROUND

With continuous rising and development of artificial intelligence (AI), big data, Internet of Things, mobile devices and communications, and cloud storage, etc., the demand for memory capacity are growing in an exponential way. Compared with other non-volatile memories, NAND memory has many advantages, such as high integration, low power consumption, fast programming/erasing speed, good reliability, low cost, etc., and thus has gradually become the mainstream semiconductor memory in the industry.

Planar NAND memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) NAND memory architecture can address the density limitation in planar memory cells. The 3D memory architecture includes a memory array and periphery devices for controlling signals to and from the memory array.

SUMMARY

In one aspect, a method for forming a three-dimensional (3D) memory device, can comprise: forming a first semiconductor structure including a core region, a staircase region, and a periphery region, comprising: forming a memory stack on a first substrate in the core region, forming a first periphery circuit on the first substrate in the periphery region, and forming a staircase structure on a side of the memory stack in the staircase region; forming a second semiconductor structure including a second periphery circuit on a second substrate; bonding the second semiconductor structure to the first semiconductor structure; forming a supplemental semiconductor layer to replace a portion of the first substrate in the core region and the staircase region; and performing an activation process to transform a portion of the supplemental semiconductor layer in the core region to an activated semiconductor layer.

In some implementations, forming the first semiconductor structure further comprises: forming the first substrate including a sacrificial substrate, a first stop layer, an initial semiconductor layer, a second stop layer, and a semiconductor film stacked in a vertical direction, wherein a first portion of the semiconductor film in the periphery region is separated from a second portion of the semiconductor film in the staircase region and the core region by a spacer structure.

In some implementations, forming the first semiconductor structure further comprises: forming a plurality of channel structures penetrating the memory stack and extending into the first substrate in the core region, each channel structure including a functional layer and a semiconductor channel.

In some implementations, forming the first semiconductor structure further comprises: forming a plurality of dummy channel structures penetrating the staircase structure and extending into the first substrate in the staircase region; and forming at least one slit structure vertically penetrating the memory stack and extending into the first substrate, and laterally extending between the plurality of channel structures in the core region.

In some implementations, forming the memory stack comprises forming a plurality of interleaved stack dielectric layers and stack gate structures stacked in a vertical direction.

In some implementations, forming the first semiconductor structure further comprises: forming a plurality of contact structures, including a plurality of word line contact structures and channel structure contact structures in the core region, a plurality of periphery contact structures in the periphery region; and forming a plurality of first interconnect contact structures connected with corresponding contact structures respectively.

In some implementations, forming the first periphery circuit comprises: forming a high voltage circuit including a plurality of high voltage transistors on the first substrate in the periphery region.

In some implementations, forming the first periphery circuit further comprises forming a low voltage circuit including a plurality of low voltage transistors on the first substrate in the periphery region.

In some implementations, forming the second periphery circuit comprises: forming a low low voltage circuit including a plurality of low low voltage transistors on the second substrate; and forming a plurality of second interconnect contact structures connected with corresponding low low voltage transistors, respectively.

In some implementations, forming the second periphery circuit further comprises forming a low voltage circuit including a plurality of low voltage transistors on the second substrate.

In some implementations, bonding the second semiconductor structure to the first semiconductor structure comprises bonding the second semiconductor structure to the first semiconductor structure in a face-to-face manner to connect the first interconnect contact structures to corresponding second interconnect contact structures respectively.

In some implementations, forming the supplemental semiconductor layer comprises: removing the sacrificial substrate and stopping at the first stop layer; removing portions of the first stop layer in the core region and the staircase region to expose portions of the initial semiconductor layer in the core region and the staircase region; removing the exposed portions of the initial semiconductor layer in the core region and the staircase region, and stopping at the second stop layer to expose portions of the channel structures; removing a portion of the functional layer of each channel structure to expose the semiconductor channel; and doping a portion of the semiconductor channel to form a doped semiconductor channel region in each channel structure.

In some implementations, removing the portion of the functional layer of each channel structure comprises: removing portions of a blocking layer, a storage layer, and a tunneling layer of each channel structure that are located above the semiconductor film; and removing the second stop layer in the core region and staircase region, and the first stop layer in the periphery region.

In some implementations, the method further comprises doping the semiconductor film in the periphery region.

In some implementations, forming the supplemental semiconductor layer further comprises forming the supplemental semiconductor layer at least in the core region and the staircase region to electrically connect with the doped semiconductor channel region of each channel structure.

In some implementations, performing the activation process comprises performing a local thermal treatment to a first portion of the supplemental semiconductor layer covering the core region without affecting a second portion of the supplemental semiconductor layer in the staircase region.

In some implementations, performing the activation process further comprises performing the local thermal treatment to transform an amorphous silicon into a polycrystalline silicon material.

In some implementations, forming the first semiconductor structure comprises: forming two core regions separated and surrounded by one staircase region; and forming one periphery region surrounding the one staircase region; wherein a length of the first portion in a word line direction is greater than a length of each of the two core regions in the word line direction, and a width of the first portion in a bit line direction is greater than a width of each of the two core regions in the bit line direction.

In some implementations, forming the first semiconductor structure comprises: forming the core region surrounded by the staircase region; and forming the periphery region surrounding the one staircase region; wherein a length of the first portion in a word line direction is greater than a length of the core region in the word line direction, and a width of the first portion in a bit line direction is greater than a width of the core region in the bit line direction.

In some implementations, the method further comprises forming a pad layer on the activated semiconductor layer and the supplemental semiconductor layer, comprising: forming a pad dielectric layer on the activated semiconductor layer in the core region, on the supplemental semiconductor layer in the staircase region, and on a remaining portion of the first substrate in the periphery region; forming a plurality of pad structures embedded in the pad dielectric layer; forming a wiring layer on the pad dielectric layer to connect with the plurality of pad structures; and forming a protection layer to cover the wiring layer.

Another aspect of the present disclosure provides a three-dimensional (3D) memory device, comprising: a first semiconductor structure including a core region, a staircase region, and a periphery region, comprising: a memory stack on an activated semiconductor layer in the core region, a staircase structure on a supplemental semiconductor layer in the staircase region, and a first periphery circuit on a doped semiconductor film in the periphery region; and a second semiconductor structure including a second periphery circuit on a substrate; wherein the second semiconductor structure is connected with the first semiconductor structure.

In some implementations, the first semiconductor structure further comprises a plurality of channel structures penetrating the memory stack in the core region, each channel structure including a functional layer and a semiconductor channel.

In some implementations, the first semiconductor structure further comprises: a plurality of dummy channel structures penetrating the staircase structure in the staircase region; and at least one slit structure vertically penetrating the memory stack and extending in a lateral direction to separate the plurality of channel structures.

In some implementations, the memory stack comprises a plurality of interleaved stack dielectric layers and stack gate structures stacked in a vertical direction.

In some implementations, the first semiconductor structure further comprises: a plurality of contact structures including a plurality of channel structure contact structures in the core region, a plurality of word line contact structures in the staircase region, and a plurality of periphery contact structures in the periphery region; and a plurality of first interconnect contact structures connected with corresponding contact structures, respectively.

In some implementations, the first periphery circuit comprises a high voltage circuit including a plurality of high voltage transistors on the initial semiconductor layer in the periphery region.

In some implementations, the first periphery circuit further comprises a low voltage circuit including a plurality of low voltage transistors on the initial semiconductor layer in the periphery region.

In some implementations, the second periphery circuit comprises: a low low voltage circuit including a plurality of low low voltage transistors on the substrate; and a plurality of second interconnect contact structures connected with corresponding low low voltage transistors, respectively.

In some implementations, the second periphery circuit further comprises a low voltage circuit including a plurality of low voltage transistors on the substrate.

In some implementations, the second semiconductor structure and the first semiconductor structure are connected in a face-to-face manner, such that the first interconnect contact structures and corresponding second interconnect contact structures are connected respectively at the bonding interface.

In some implementations, the semiconductor film in the periphery region includes single crystalline silicon; the activated semiconductor layer comprises doped polycrystalline silicon.

In some implementations, the functional layer of each channel structure comprises a blocking layer, a storage layer, and a tunneling layer; and the semiconductor channel comprises a doped semiconductor channel region contacting the activated semiconductor layer.

In some implementations, the activated semiconductor layer and the supplemental semiconductor layer are in a first level in a vertical direction; and the semiconductor film is in a second level in the vertical direction different from the first level.

In some implementations, the first semiconductor structure further comprises a pad layer on the activated semiconductor layer and the supplemental semiconductor layer.

In some implementations, the pad layer comprises: a pad dielectric layer on the activated semiconductor layer, the supplemental semiconductor layer, and the initial semiconductor layer; a plurality of pad structures embedded in the pad dielectric layer; a wiring layer on the pad dielectric layer in the activated semiconductor layer and the supplemental semiconductor layer to connect with the plurality of pad structures; and a protection layer to cover the wiring layer.

In some implementations, the first semiconductor structure further comprises a spacer layer configured to separate a first portion of the semiconductor film in the periphery region and a second portion of the semiconductor film in the staircase region and the core region by a spacer structure.

Another aspect of the present disclosure provides a memory system, comprising: a memory device configured to store data, and comprising: a first semiconductor structure including a core region, a staircase region, and a periphery region, comprising: a memory stack including an array of memory cells on an activated semiconductor layer in the core region, a staircase structure on a supplemental semiconductor layer in the staircase region, and a first periphery circuit on a semiconductor film in the periphery region; a second semiconductor structure including a second periphery circuit on a substrate, wherein the second semiconductor structure is connected with the first semiconductor structure; and a memory controller coupled to the memory device and configured to control the array of memory cells through the first peripheral circuit and the second periphery circuit.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
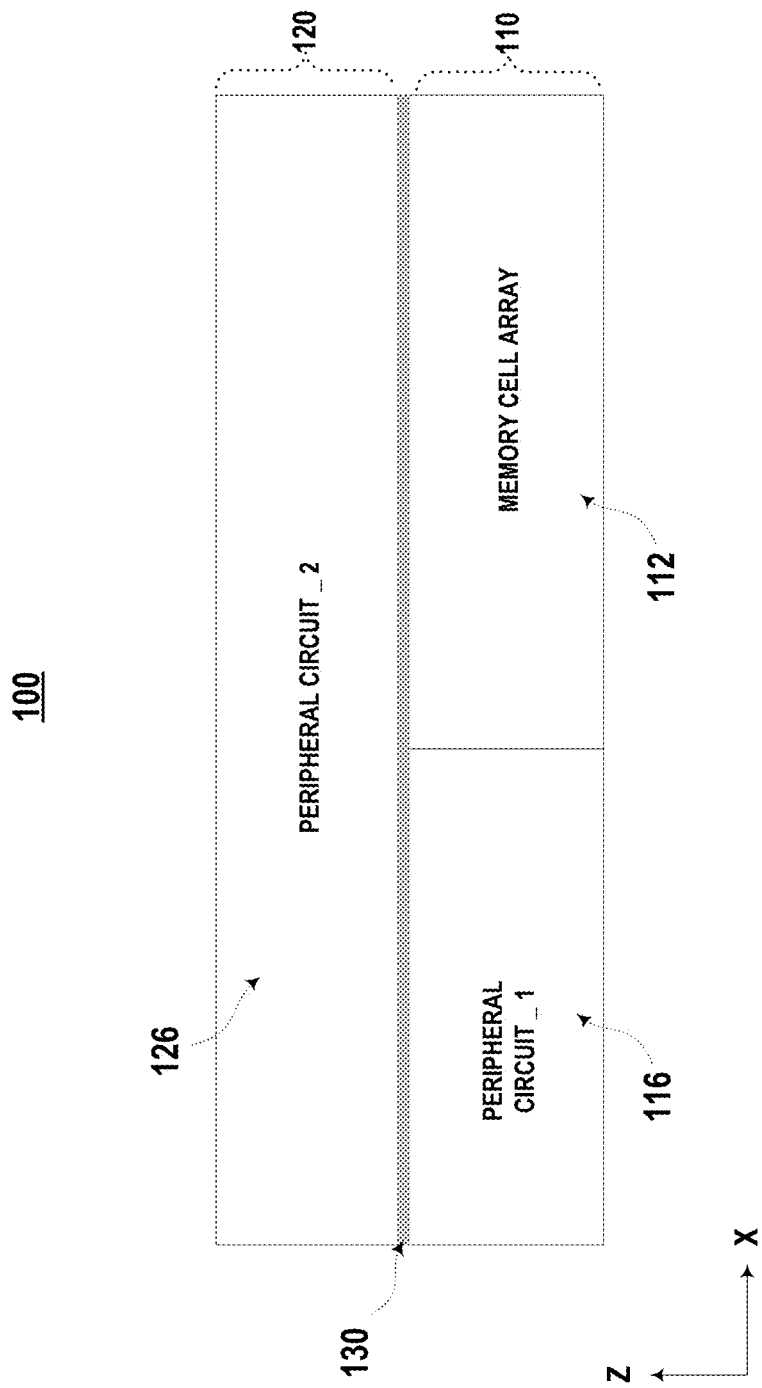
FIG. 1 illustrates a schematic diagram of a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contact structures are formed) and one or more dielectric layers.

As semiconductor technology advances, three-dimensional (3D) memory devices, such as 3D NAND memory devices, keep scaling more oxide/nitride (ON) layers of the memory cell array. With the increase of the number of array layers of the 3D architecture, the complementary metal-oxide semiconductor (CMOS) periphery circuit needs more complex and size scaling. For example, a complementary metal-oxide-semiconductor wafer ("CMOS wafer" hereinafter) is bonded with a memory cell array wafer ("array wafer" hereinafter) to form a framework of the 3D memory device. In order to achieve optimization of area, the CMOS driver circuit can be divided into two parts: a high-voltage driver part and an input/output (I/O) logic part. However, those architectures of the 3D NAND array and CMOS periphery circuits restrict the performance of the 3D NAND memory devices.

Accordingly, new 3D memory devices and fabricating methods thereof are provided to address such issues. In some implementations, the 3D memory device can be a part of a non-monolithic 3D memory device, in which components (e.g., portions of the CMOS devices and the memory cell array device) are formed separately on different wafers and then bonded in a face-to-face manner. In some implementations, as described below in connection with the figures, a first wafer including the memory cell array is flipped and faces down towards a second wafer for hybrid bonding, so that in the bonded non-monolithic 3D memory device, the first wafer is above the second wafer. It is understood that in some other implementations, the first wafer remains as the substrate of the bonded non-monolithic 3D memory device, and the second wafer is flipped and faces down towards the first wafer for hybrid bonding. In some other implementations not shown in the figures, the 3D memory device can also be a part of a monolithic 3D memory device, in which components (e.g., portions of the CMOS devices and the memory cell array device) are formed on a same wafer.

FIG. 1 illustrates a schematic view of a cross-section of a 3D memory device 100, according to some aspects of the present disclosure. 3D memory device 100 represents an example of a bonded chip. In some implementations, at least some of the components of 3D memory device 100 (e.g., first wafer/first semiconductor structure 110 and second wafer/second semiconductor structure 120 as shown in FIG. 1) are formed separately on different substrates in parallel and then jointed to form a bonded chip (a process referred to herein as a "parallel process").

It is noted that X and Z axes are added in FIG. 1 to further illustrate the spatial relationships of the components of a semiconductor device. A substrate of a semiconductor device, e.g., 3D memory device 100, includes two lateral surfaces (e.g., a top surface and a bottom surface) extending laterally in the x– direction (e.g., a bit line direction). As used herein, whether one component (e.g., a layer or a device) is "on," "above," or "below" another component (e.g., a layer or a device) of a semiconductor device is determined relative to the substrate of the semiconductor device in the Z direction (the vertical direction or thickness direction) when the substrate is positioned in the lowest plane of the semiconductor device in the Z direction. The same notion for describing the spatial relationships is applied throughout the present disclosure.

3D memory device 100 can include a first semiconductor structure 110 including an array of memory cells (also referred to herein as a "memory cell array 112") and a first periphery circuit 116 of the memory cell array 112. In some implementations, the memory cell array 112 includes an array of NAND Flash memory cells. For ease of description, a NAND Flash memory cell array may be used as an example for describing the memory cell array 112 in the present disclosure. But it is understood that the memory cell array 112 is not limited to NAND Flash memory cell array and may include any other suitable types of memory cell arrays, such as NOR Flash memory cell array, phase change memory (PCM) cell array, resistive memory cell array, magnetic memory cell array, spin transfer torque (STT) memory cell array, to name a few.

First semiconductor structure 110 can include a NAND Flash memory device in which memory cells are provided in the form of an array of 3D NAND memory strings and/or an array of two-dimensional (2D) NAND memory cells. NAND memory cells can be organized into pages or fingers, which are then organized into blocks in which each NAND memory cell is coupled to a separate line called a bit line (BL). All cells with the same vertical position in the NAND memory cell can be coupled through the control gates by a word line (WL). In some implementations, a memory plane contains a certain number of blocks that are coupled through the same bit line. First semiconductor structure 110 can include one or more memory planes.

In some implementations, the array of NAND memory cells is an array of 2D NAND memory cells, each of which includes a floating-gate transistor. The array of 2D NAND memory cells includes a plurality of 2D NAND memory strings, each of which includes a plurality of memory cells connected in series (resembling a NAND gate) and two select transistors, according to some implementations. Each 2D NAND memory string is arranged in the same plane (i.e., referring to herein a flat, two-dimensional (2D) surface, different from the term "memory plane" in the present discourse) on the substrate, according to some implementations. In some implementations, the array of NAND memory cells is an array of 3D NAND memory strings, each of which extends vertically above the substrate (in 3D) through a stack structure, e.g., a memory stack. Depending on the 3D NAND technology (e.g., the number of layers/tiers in the memory stack), a 3D NAND memory string typically includes a certain number of NAND memory cells, each of which includes a floating-gate transistor or a charge-trap transistor.

As shown in FIG. 1, 3D memory device 100 can also include some periphery circuits of the memory cell array to perform all the read/program (write)/erase operations. That is, the periphery circuits of the memory cell array can be separated into at least two other semiconductor structures (e.g., 110 and 120 in FIG. 1). The periphery circuits (a.k.a.

control and sensing circuits) can include any suitable digital, analog, and/or mixed-signal circuits used for facilitating the operations of the memory cell array. For example, the periphery circuits can include one or more of a page buffer, a decoder (e.g., a row decoder and a column decoder), a sense amplifier, a driver (e.g., a word line driver), an I/O circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The periphery circuits in first semiconductor structure 110 and second semiconductor structure 120 can use CMOS technology, e.g., which can be implemented with logic processes in any suitable technology nodes.

As shown in FIG. 1, first semiconductor structure 110 and second semiconductor structure 120 are stacked in two different planes, according to some implementations. Memory cell array 112 and first periphery circuit 116 can be arranged in first semiconductor structure 110. Second periphery circuit can be arranged in second semiconductor structure 120, and can be stacked over first semiconductor structure 110 to reduce the planar size of 3D memory device 100, compared with memory devices in which all the periphery circuits are disposed in a same plane.

As shown in FIG. 1, 3D memory device 100 further includes a bonding interface 130 vertically between first semiconductor structure 110 and second semiconductor structure 120. Bonding interface 130 can be an interface between two semiconductor structures formed by any suitable bonding technologies as described below in detail, such as hybrid bonding, anodic bonding, fusion bonding, transfer bonding, adhesive bonding, and eutectic bonding, to name a few. In some implementations, as shown in FIG. 1, second semiconductor structure 120 is bonded to first semiconductor structure 110 on opposite sides thereof.

In some implementations, second semiconductor structure 120 does not include any memory cell. In other words, second semiconductor structure 120 only includes periphery circuits, but not the memory cell array, according to some implementations. As a result, the memory cell array can be only included in first semiconductor structure 110, but not second semiconductor structure 120.

As described below in detail, first semiconductor structure 110 and second semiconductor structure 120 can be fabricated separately (and in parallel in some implementations) by the parallel process, such that the thermal budget of fabricating one of first and second semiconductor structures 110 and 120 does not limit the processes of fabricating another one of first and second semiconductor structures 110 and 120. Moreover, a large number of interconnects (e.g., bonding contact structures and/or inter-layer vias (ILVs)/through substrate vias (TSVs)) can be formed across bonding interface 130 to make direct, short-distance (e.g., micron- or submicron-level) electrical connections between first and second semiconductor structures 110 and 120, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer among the memory cell array and the different periphery circuits in first and second semiconductor structures 110 and 120 can be performed through the interconnects (e.g., bonding contact structures and/or ILVs/TSVs) across bonding interface 130. By vertically integrating first and second semiconductor structures 110 and 120, the chip size can be reduced, and the memory cell density can be increased.

Figure 2:
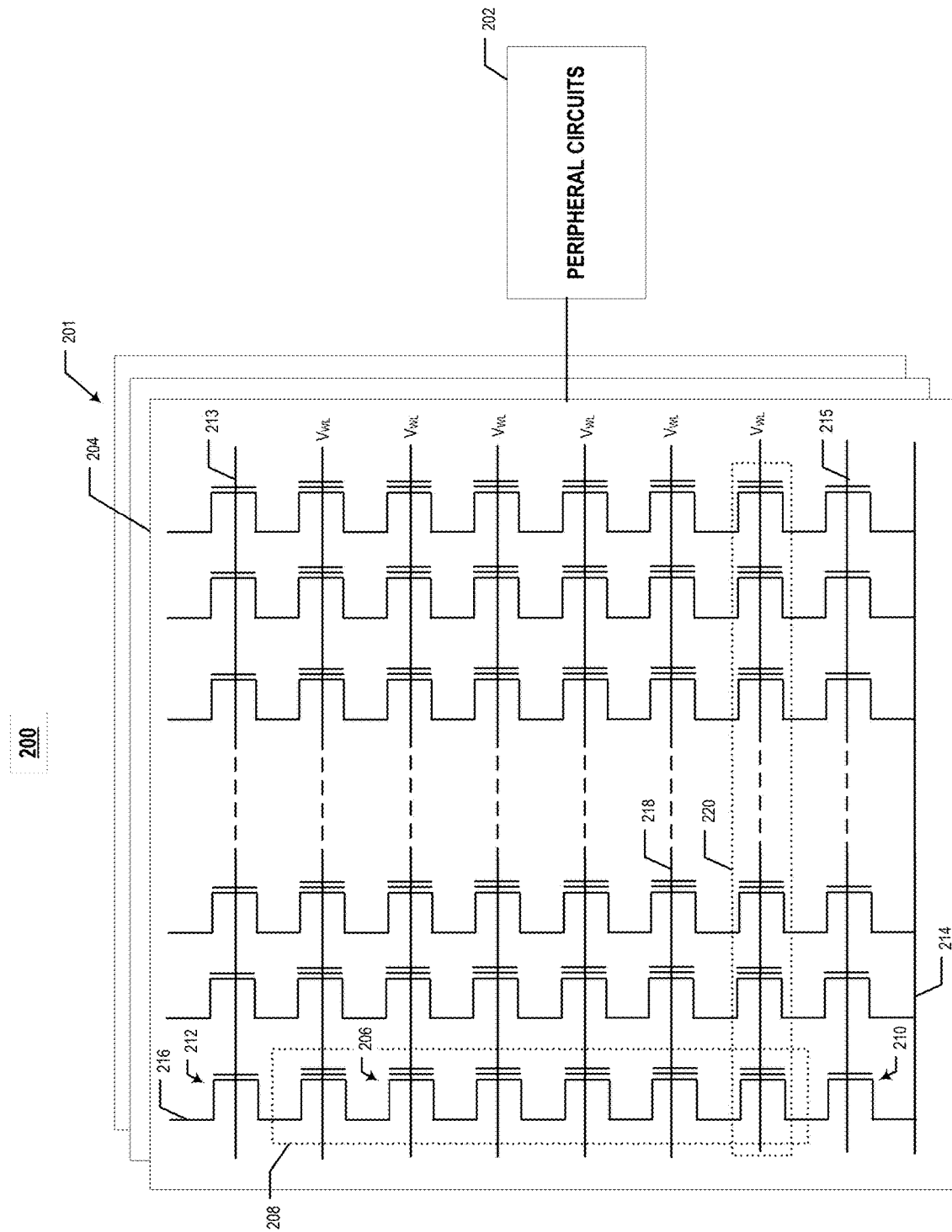
FIG. 2 illustrates a schematic circuit diagram of an exemplary memory device, according to some aspects of the present disclosure.

FIG. 2 illustrates a schematic circuit diagram of a memory device 200 including periphery circuits, according to some aspects of the present disclosure. Memory device 200 can include a memory cell array 201 and periphery circuits 202 coupled to memory cell array 201. 3D memory device 100 may be an example of memory device 200 in which memory cell array 201 and at least two portions of periphery circuits 202 may be included in first and second semiconductor structures 110 and 120. Memory cell array 201 can be a NAND Flash memory cell array in which memory cells 206 are provided in the form of an array of NAND memory strings 208 each extending vertically above a substrate (not shown). In some implementations, each NAND memory string 208 includes a plurality of memory cells 206 coupled in series and stacked vertically. Each memory cell 206 can hold a continuous, analog value, such as an electrical voltage or charge, that depends on the number of electrons trapped within a region of memory cell 206. Each memory cell 206 can be either a floating gate type of memory cell including a floating-gate transistor or a charge trap type of memory cell including a charge-trap transistor.

In some implementations, each memory cell 206 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 206 is a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 2, each NAND memory string 208 can include a source select gate (SSG) transistor 210 at its source end and a drain select gate (DSG) transistor 212 at its drain end. SSG transistor 210 and DSG transistor 212 can be configured to activate selected NAND memory strings 208 (columns of the array) during read and program operations. In some implementations, SSG transistors 210 of NAND memory strings 208 in the same block 204 are coupled through a same source line (SL) 214, e.g., a common SL, for example, to the ground. DSG transistor 212 of each NAND memory string 208 is coupled to a respective bit line 216 from which data can be read or programmed via an output bus (not shown), according to some implementations. In some implementations, each NAND memory string 208 is configured to be selected or deselected by applying a select voltage (e.g., above the threshold voltage of DSG transistor 212) or a deselect voltage (e.g., 0 V) to respective DSG transistor 212 through one or more DSG lines 213 and/or by applying a select voltage (e.g., above the threshold voltage of SSG transistor 210) or a deselect voltage (e.g., 0 V) to respective SSG transistor 210 through one or more SSG lines 215.

As shown in FIG. 2, NAND memory strings 208 can be organized into multiple blocks 204, each of which can have a common source line 214. In some implementations, each block 204 is the basic data unit for erase operations, i.e., all memory cells 206 on the same block 204 are erased at the same time. Memory cells 206 of adjacent NAND memory strings 208 can be coupled through word lines 218 that select which row of memory cells 206 is affected by read and program operations. In some implementations, each word line 218 is coupled to a page 220 of memory cells 206, which is the basic data unit for program and read operations. The size of one page 220 in bits can correspond to the number of NAND memory strings 208 coupled by word line 218 in one block 204. Each word line 218 can include a plurality of control gates (gate electrodes) at each memory cell 206 in respective page 220 and a gate line coupling the control gates.

Figure 3:
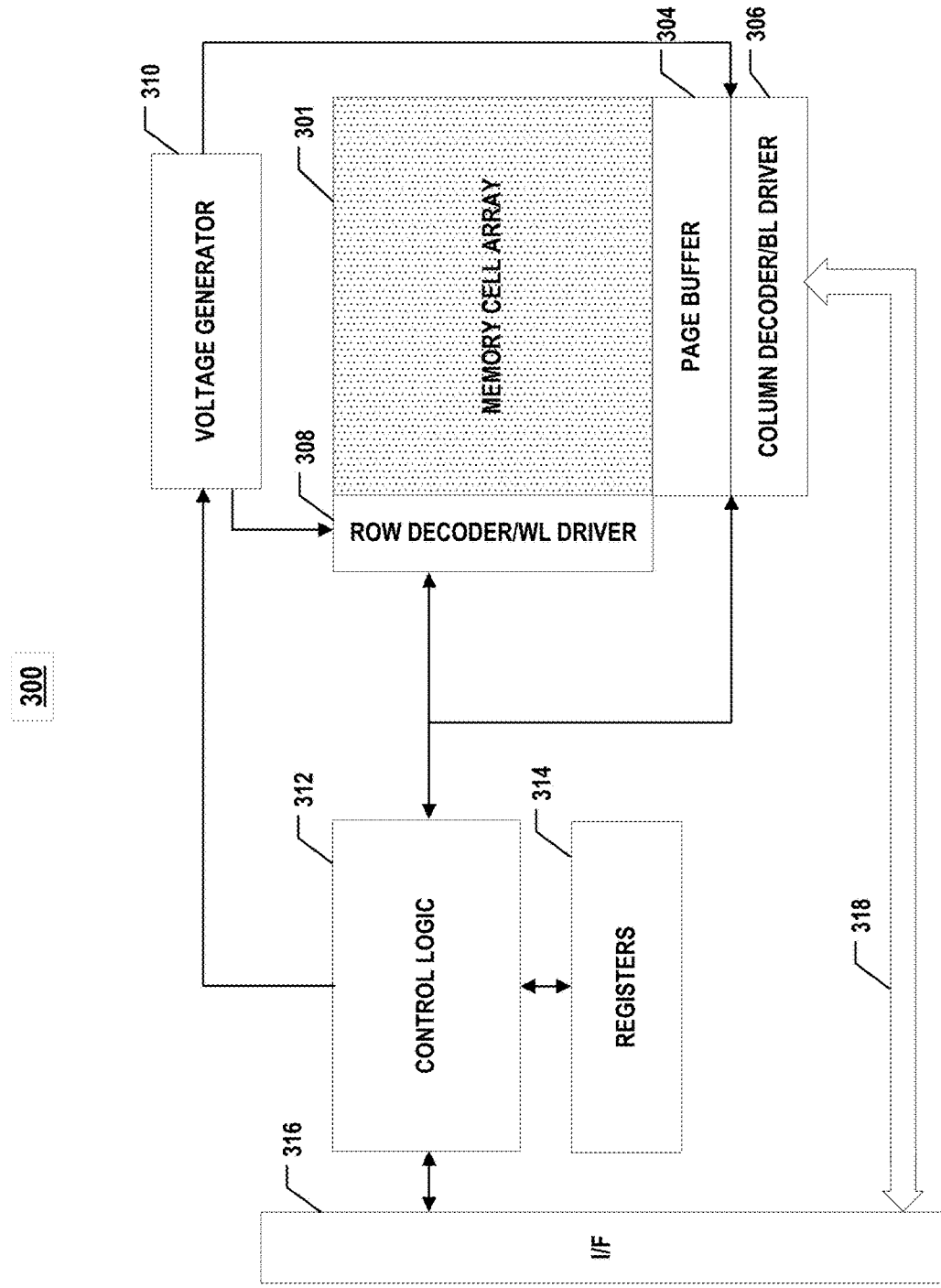
FIG. 3 illustrates a schematic circuit diagram of an exemplary memory device, according to some aspects of the present disclosure.

Referring to FIG. 2, periphery circuits 202 can be coupled to memory cell array 201 through bit lines 216, word lines 218, source lines 214, SSG lines 215, and DSG lines 213. As described above, periphery circuits 202 can include any suitable circuits for facilitating the operations of memory cell array 201 by applying and sensing voltage signals and/or current signals through bit lines 216 to and from each target memory cell 206 through word lines 218, source lines 214, SSG lines 215, and DSG lines 213. Periphery circuits 202 can include various types of periphery circuits formed using CMOS technologies. For example, FIG. 3 illustrates memory device 300 including a memory cell array 301 and various exemplary periphery circuits 202. Periphery circuits 202 include a page buffer 304, a column decoder/bit line driver 306, a row decoder/word line driver 308, a voltage generator 310, control logic 312, registers 314, an interface (I/F) 316, and a data bus 318. It is understood that in some examples, additional periphery circuits 202 may be included as well.

Page buffer 304 can be configured to buffer data read from or programmed to memory cell array 201 according to the control signals of control logic 312. In one example, page buffer 304 may store one page of program data (write data) to be programmed into one page 220 of memory cell array 201. In another example, page buffer 304 also performs program verify operations to ensure that the data has been properly programmed into memory cells 206 coupled to selected word lines 218.

Row decoder/word line driver 308 can be configured to be controlled by control logic 312 and select block 204 of memory cell array 201 and a word line 218 of selected block 204. Row decoder/word line driver 308 can be further configured to drive memory cell array 201. For example, row decoder/word line driver 308 may drive memory cells 206 coupled to the selected word line 218 using a word line voltage generated from voltage generator 310.

Column decoder/bit line driver 306 can be configured to be controlled by control logic 312 and select one or more 3D NAND memory strings 208 by applying bit line voltages generated from voltage generator 310. For example, column decoder/bit line driver 306 may apply column signals for selecting a set of N bits of data from page buffer 304 to be outputted in a read operation.

Control logic 312 can be coupled to each periphery circuit 202 and configured to control operations of periphery circuits 202. Registers 314 can be coupled to control logic 312 and include status registers, command registers, and address registers for storing status information, command operation codes (OP codes), and command addresses for controlling the operations of each periphery circuit 202.

Interface 316 can be coupled to control logic 312 and configured to interface memory cell array 201 with a memory controller (not shown). In some implementations, interface 316 acts as a control buffer to buffer and relay control commands received from the memory controller and/or a host (not shown) to control logic 312 and status information received from control logic 312 to the memory controller and/or the host. Interface 316 can also be coupled to page buffer 304 and column decoder/bit line driver 306 via data bus 318 and act as an I/O interface and a data buffer to buffer and relay the program data received from the memory controller and/or the host to page buffer 304 and the read data from page buffer 304 to the memory controller and/or the host. In some implementations, interface 316 and data bus 318 are parts of an I/O circuit of periphery circuits 202.

Voltage generator 310 can be configured to be controlled by control logic 312 and generate the word line voltages (e.g., read voltage, program voltage, pass voltage, local voltage, and verification voltage) and the bit line voltages to be supplied to memory cell array 201. In some implementations, voltage generator 310 is part of a voltage source that provides voltages at various levels of different periphery circuits 202 as described below in detail. Consistent with the scope of the present disclosure, in some implementations, the voltages provided by voltage generator 310, for example, to row decoder/word line driver 308, column decoder/bit line driver 306, and page buffer 304 are above certain levels that are sufficient to perform the memory operations. For example, the voltages provided to the page buffer circuits in page buffer 304 and/or the logic circuits in control logic 312 may be between 1.3 V and 5 V, such as 3.3 V, and the voltages provided to the driving circuits in row decoder/word line driver 308 and/or column decoder/bit line driver 306 may be between 5 V and 30 V.

Figure 4A:
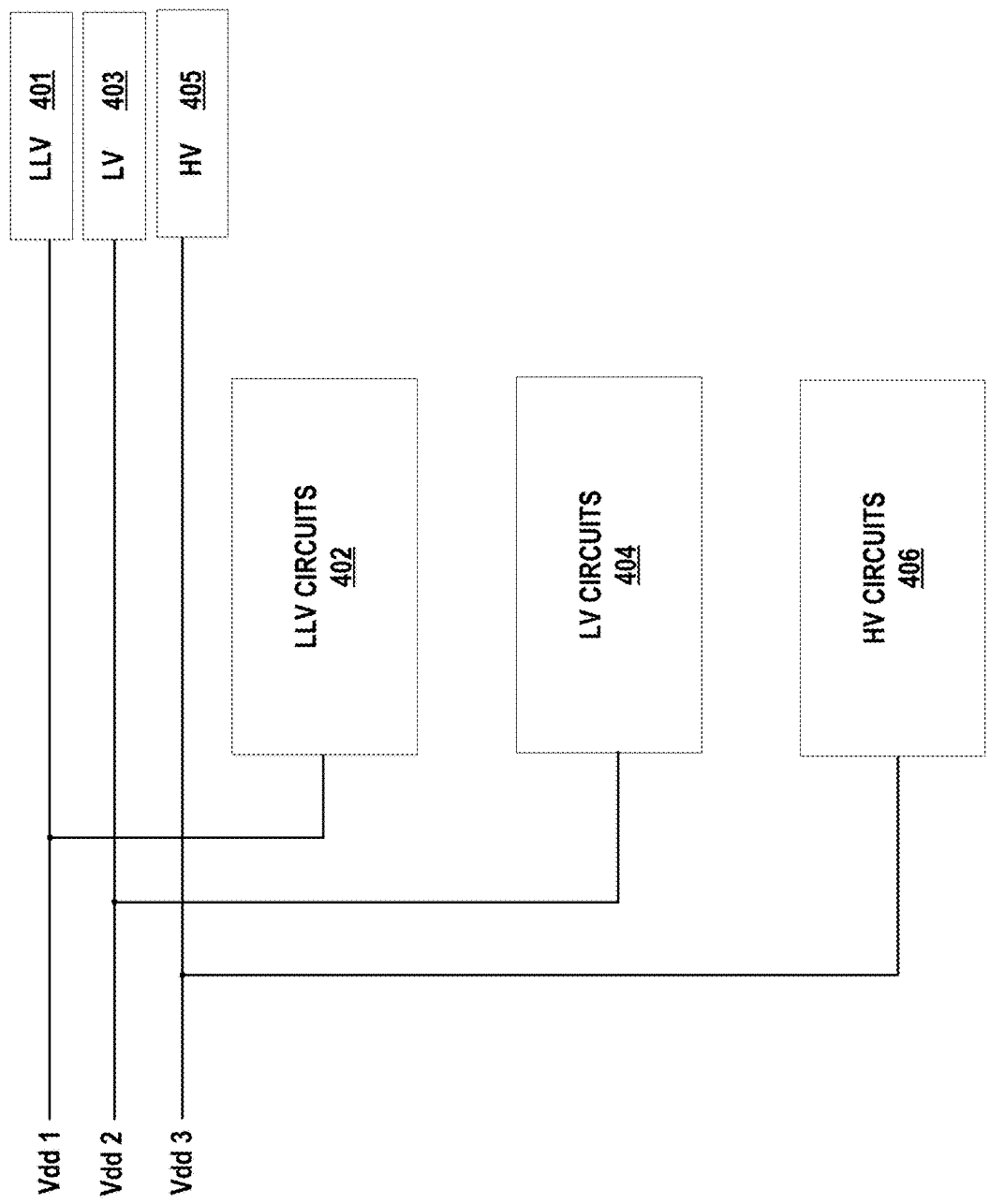
FIG. 4A illustrates a block diagram of periphery circuits provided with various voltages, according to some aspects of the present disclosure.

Different from logic devices (e.g., microprocessors), memory devices, such as 3D NAND Flash memory, require a wide range of voltages to be supplied to different memory periphery circuits. For example, FIG. 4A illustrates a block diagram of periphery circuits provided with various voltages, according to some aspects of the present disclosure. In some implementations, a memory device (e.g., memory device 200) includes a low low voltage (LLV) source 401, a low voltage (LV) source 403, and a high voltage (HV) source 405, each of which is configured to provide a voltage at a respective level (Vdd1, Vdd2, or Vdd3). For example, Vdd3>Vdd2>Vdd1. Each voltage source 401, 403, or 405 can receive a voltage input at a suitable level from an external power source (e.g., a battery). Each voltage source 401, 403, or 405 can also include voltage converters and/or voltage regulators to convert the external voltage input to the respective level (Vdd1, Vdd2, or Vdd3) and maintain and output the voltage at the respective level (Vdd1, Vdd2, or Vdd3) through a corresponding power rail. In some implementations, voltage generator 310 of memory device 200 is part of voltage sources 401, 403, and 405.

In some implementations, LLV voltage source 401 is configured to provide a voltage below 1.3 V, such as between 0.9 V and 1.2 V (e.g., 0.9 V, 0.95 V, 1 V, 1.05 V, 1.1 V, 1.15 V, 1.2 V, any range bounded by the lower end by any of these values, or in any range defined by any two of these values). In one example, the voltage is 1.2 V. In some implementations, LV voltage source 403 is configured to provide a voltage between 1.3 V and 3.3 V (e.g., 1.3 V, 0. 1.4 V, 1.5 V, 1.6 V, 1.7 V, 1.8 V, 1.9 V, 2 V, 2.1 V, 2.2 V, 2.3 V, 2.4 V, 2.5 V, 2.6 V, 2.7 V, 2.8 V, 2.9 V, 3 V, 3.1 V, 3.2 V, 3.3 V, any range bounded by the lower end by any of these values, or in any range defined by any two of these values). In one example, the voltage is 3.3 V. In some implementations, HV voltage source 405 is configured to provide a voltage greater than 3.3 V, such as between 5 V and 30 V (e.g., 5 V, 6 V, 7 V, 8 V, 9 V, 10 V, 11 V, 12 V, 13 V, 14 V, 15 V, 16 V, 17 V, 18 V, 19 V, 20 V, 21 V, 22 V, 23 V, 24 V, 25 V, 26 V, 27 V, 28 V, 29 V, 30 V, any range bounded by the lower end by any of these values, or in any range defined by any two of these values). It is understood that the voltage ranges described above with respect to HV voltage source 405, LV voltage source 403, and LLV voltage source 401 are for illustrative purposes and non-limiting, and any other suitable voltage ranges may be provided by HV voltage source 405, LV voltage source 403, and LLV voltage source 401.

Based on their suitable voltage levels (Vdd1, Vdd2, or Vdd3), the memory periphery circuits (e.g., periphery circuits 202) can be categorized into LLV circuits 402, LV circuits 404, and HV circuits 406, which can be coupled to LLV voltage source 401, LV voltage source 403, and HV voltage source 405, respectively. In some implementations, HV circuits 406 includes one or more driving circuits that are coupled to the memory cell array (e.g., memory cell array 201) through word lines, bit lines, SSG lines, DSG lines, source lines, etc., and configured to drive the memory cell array by applying a voltage at a suitable level to the word lines, bit lines, SSG lines, DSG lines, source lines, etc., when performing memory operations (e.g., read, program, or erase). In one example, HV circuit 406 may include word line driving circuits (e.g., in row decoder/word line driver 308) that are coupled to word lines and apply a program voltage (Vprog) or a pass voltage (Vpass) in the range of, for example, 5 V and 30 V, to the word lines during program operations. In another example, HV circuit 406 may include bit line driving circuits (e.g., in column decoder/bit line driver 306) that are coupled to bit lines and apply an erase voltage (Veras) in the range of, for example, 5 V and 30 V, to bit lines during erase operations. In some implementations, LV circuits 404 include page buffer circuits (e.g., in latches of page buffer 304) and are configured to buffer the data read from or programmed to the memory cell array. For example, the page buffer may be provided with a voltage of, for example, 3.3 V, by LV voltage source 403. LV circuits 404 can also include logic circuits (e.g., in control logic 312). In some implementations, LLV circuits 402 include an I/O circuit (e.g., in interface 316 and/or data bus 318) configured to interface the memory cell array with a memory controller. For example, the I/O circuit may be provided with a voltage of, for example, 1.2 V, by LLV voltage source 401.

Figure 4B:
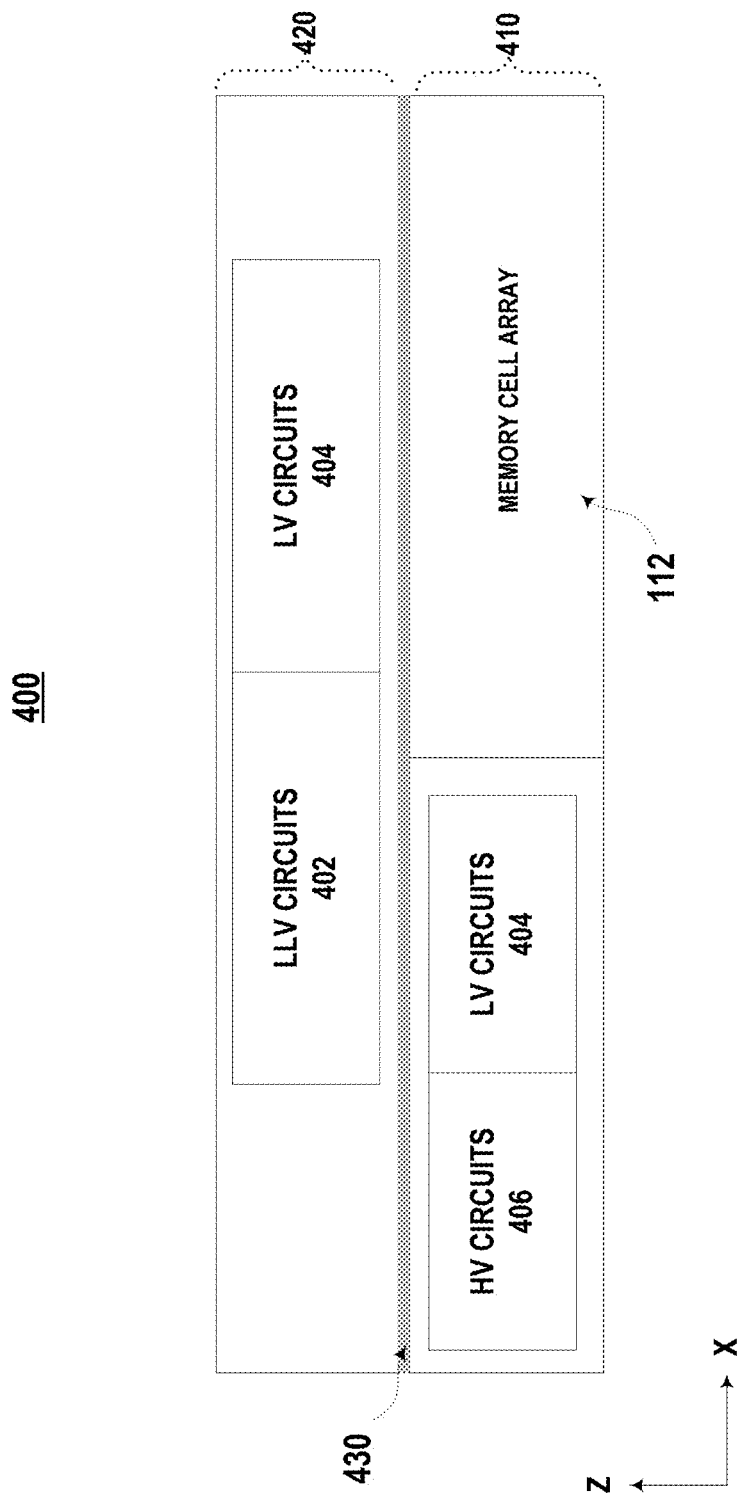
FIG. 4B illustrates a schematic diagram of a cross-section of an exemplary 3D memory device including periphery circuits with various voltages, according to some aspects of the present disclosure.

As described above, to reduce the total area occupied by the memory periphery circuits, periphery circuits 202 can be separately formed in different planes based on different performance requirements, such as the applied voltages. For example, FIG. 4B illustrates a schematic diagram of periphery circuits provided with various voltages arranged in separate semiconductor structures, according to some aspects of the present disclosure. In some implementations, HV circuits 406 and LLV circuits 402 are separated, for example, in a first semiconductor structure 410 and a second semiconductor structure 420, respectively, due to their significant difference in voltages and the resulting difference in device dimensions, such as different semiconductor layer (e.g., substrate or thinned substrate) thicknesses and different gate dielectric thicknesses. In one example, the thickness of the semiconductor layer (e.g., a substrate or a thinned substrate) in which HV circuits 406 are formed in first semiconductor structure 410 may be larger than the thickness of the semiconductor layer (e.g., a substrate or a thinned substrate) in which LLV circuits 402 are formed in second semiconductor structure 420. In another example, the thickness of the gate dielectric of transistors forming HV circuits 406 may be larger than the thickness of the gate dielectric of transistors forming LLV circuits 402. For example, the thickness difference may be at least 5-fold. It is understood that stacked LLV circuits 402 and HV circuits 406 in different planes may be formed in two semiconductor structure 410 or 420 separated by a bonding interface 430.

LV circuits 404 can be formed in either first semiconductor structure 410 or second semiconductor structure 420, i.e., in the same plane as LLV circuits 402 or HV circuits 406. As shown in FIG. 4B, in some implementations, some of LV circuits 404 are formed in first semiconductor structure 410, i.e., in the same plane as LLV circuits 402, while some of LV circuits 404 are formed in second semiconductor structure 420, i.e., in the same plane as HV circuits 406. That is, LV circuits 404 can be separated into different planes as well. For example, as shown in FIG. 1, first periphery circuit 116 can include HV circuits 406 and some of LV circuits 404, and second periphery circuit 126 can include LLV circuits 402 and some of LV circuits 404.

In some implementations, the same voltage is applied to both LV circuits 404 in first semiconductor structure 410 and the LV circuits 404 in second semiconductor structure 420, such that the voltage applied to HV circuits 406 in first semiconductor structure 410 is higher than the voltage applied to LV circuits 404 in second semiconductor structure 420, which is in turn higher than the voltage applied to LLV circuits 402 in second semiconductor structure 420. Moreover, since the voltage applied to LV circuits 404 is between the voltages applied to HV circuits 406 and LLV circuits 402, the thickness of the gate dielectric of transistors forming LV circuits 404 is between the thickness of the gate dielectric of transistors forming HV circuits 406 and the thickness of the gate dielectric of transistors forming LLV circuits 402, according to some implementations. For example, the gate dielectric thickness of transistors forming LV circuits 404 may be larger than the gate dielectric thickness of transistors forming LLV circuits 402, but smaller than the gate dielectric thickness of transistors forming HV circuits 406.

Based on the different performance requirements (e.g., associated with different applied voltages), periphery circuits 202 can be separated into at least two stacked semiconductor structures 410 and 420 in different planes. For example, the I/O circuits in interface 316 and/or data bus 318 (as LLV circuits 402) and logic circuits in control logic 312 (as part of LV circuits) are disposed in second semiconductor structure 420, while the page buffer circuits in page buffer 304 and driving circuits in row decoder/word line driver 308 and column decoder/bit line driver 306 are disposed in first semiconductor structure 410.

Figure 5A:
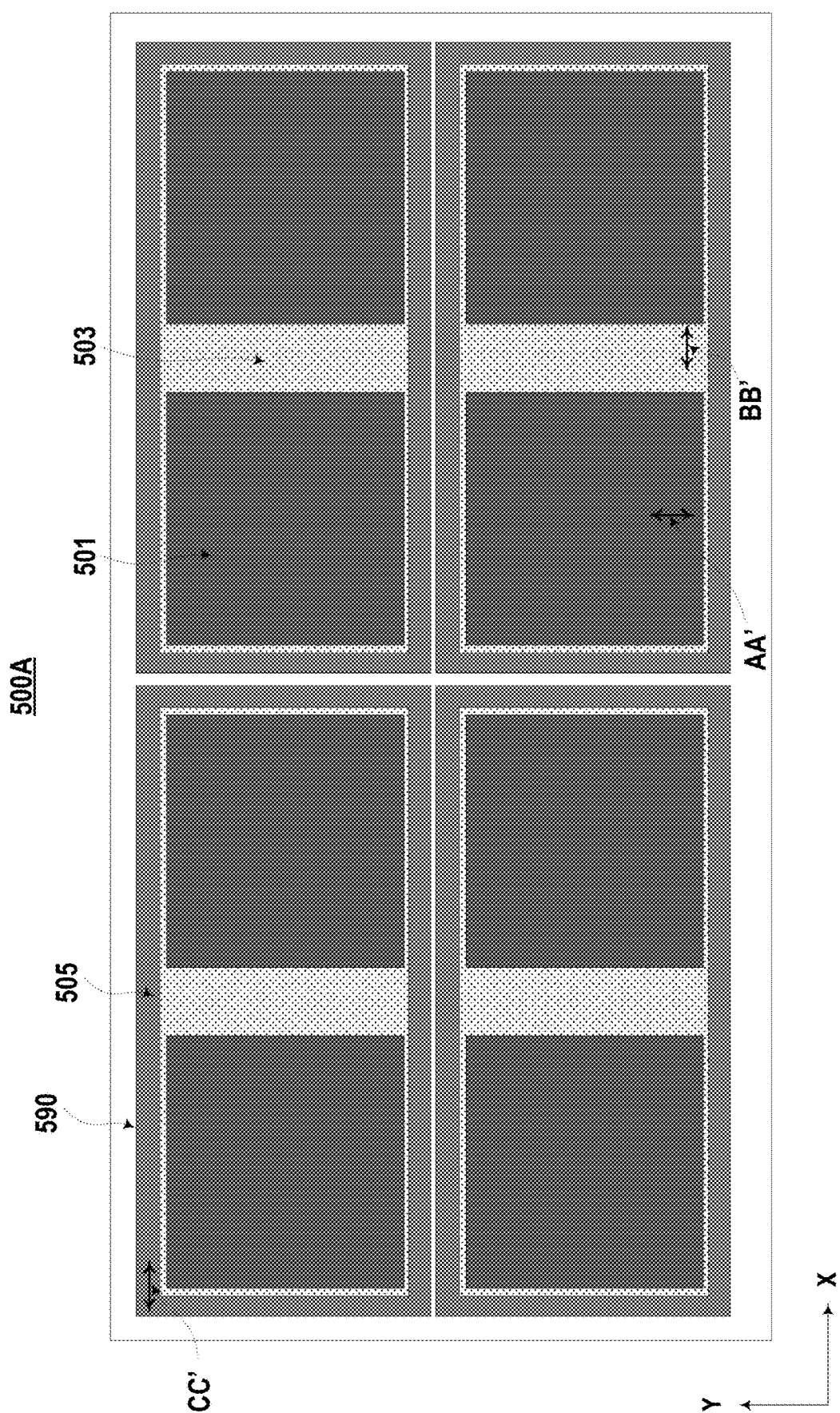
FIGS. 5A and 5B illustrate schematic diagrams of exemplary 3D memory dies in a top view, according to various aspects of the present disclosure.
Figure 5B:
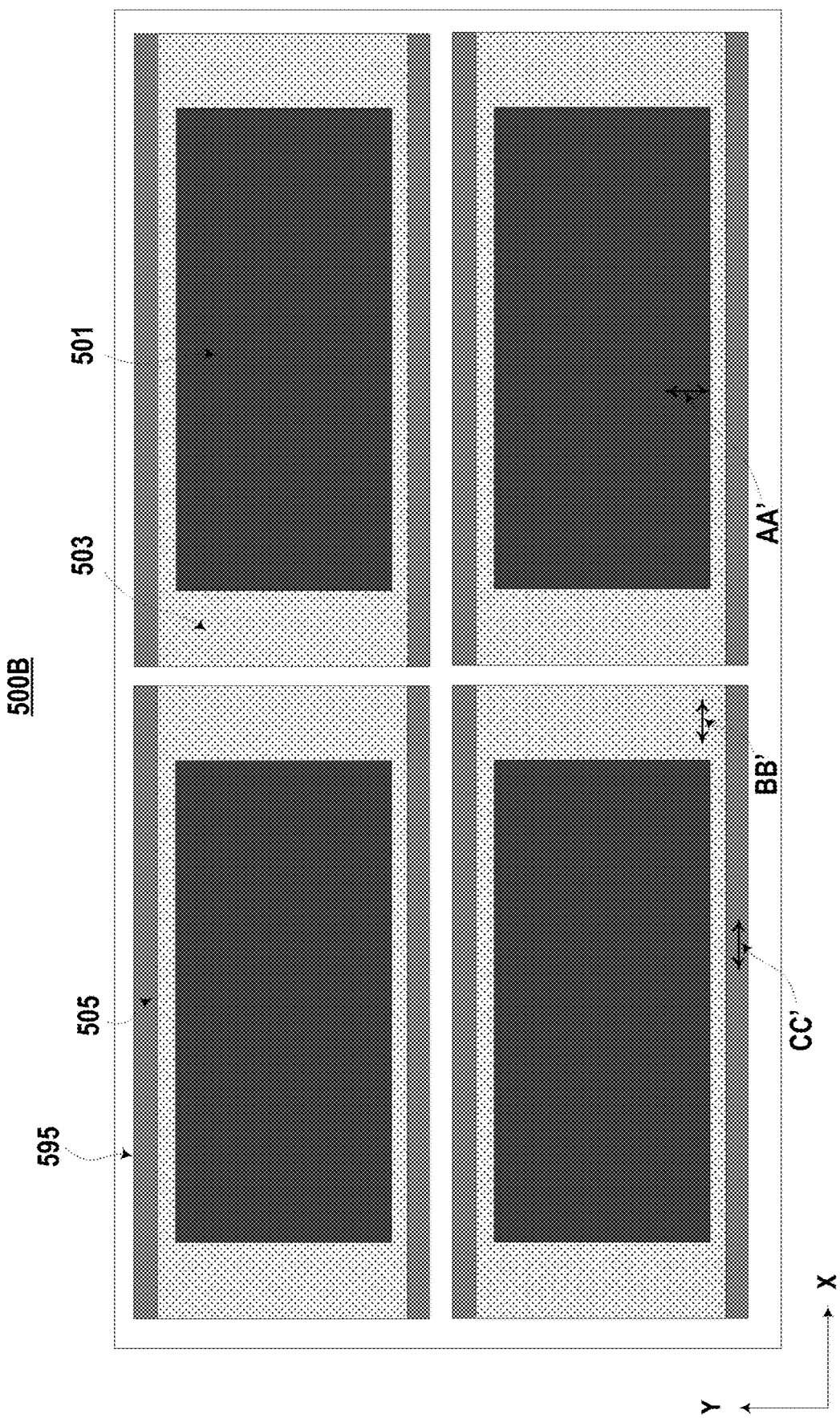

FIGS. 5A and 5B illustrate schematic diagrams of exemplary 3D memory dies 500A and 500B in a top view, according to various aspects of the present disclosure. It is noted that, a memory die of a 3D memory device can include one or more memory planes, such as four memory planes as shown in FIGS. 5A and 5B. Identical and concurrent operations can take place at each memory plane 590. Each memory plane can include one or more core regions 501, one or more staircase regions 503, and one or more periphery regions 505.

In some implementations as shown in FIG. 5A, each memory plane 590 of memory die 500A can include two core regions 501 that are separated and surrounded by a staircase region 503. A periphery region 505 can be located at four sides of each memory plane 590 to surround staircase region 503 and core regions 501. In some other implementations as shown in FIG. 5B, each memory plane 595 of memory die 500B can include one core region 501, one staircase region 503 surrounding the core region 501. Two periphery regions 505 can be located at two opposite sides of each memory plane 595.

Figure 5C:
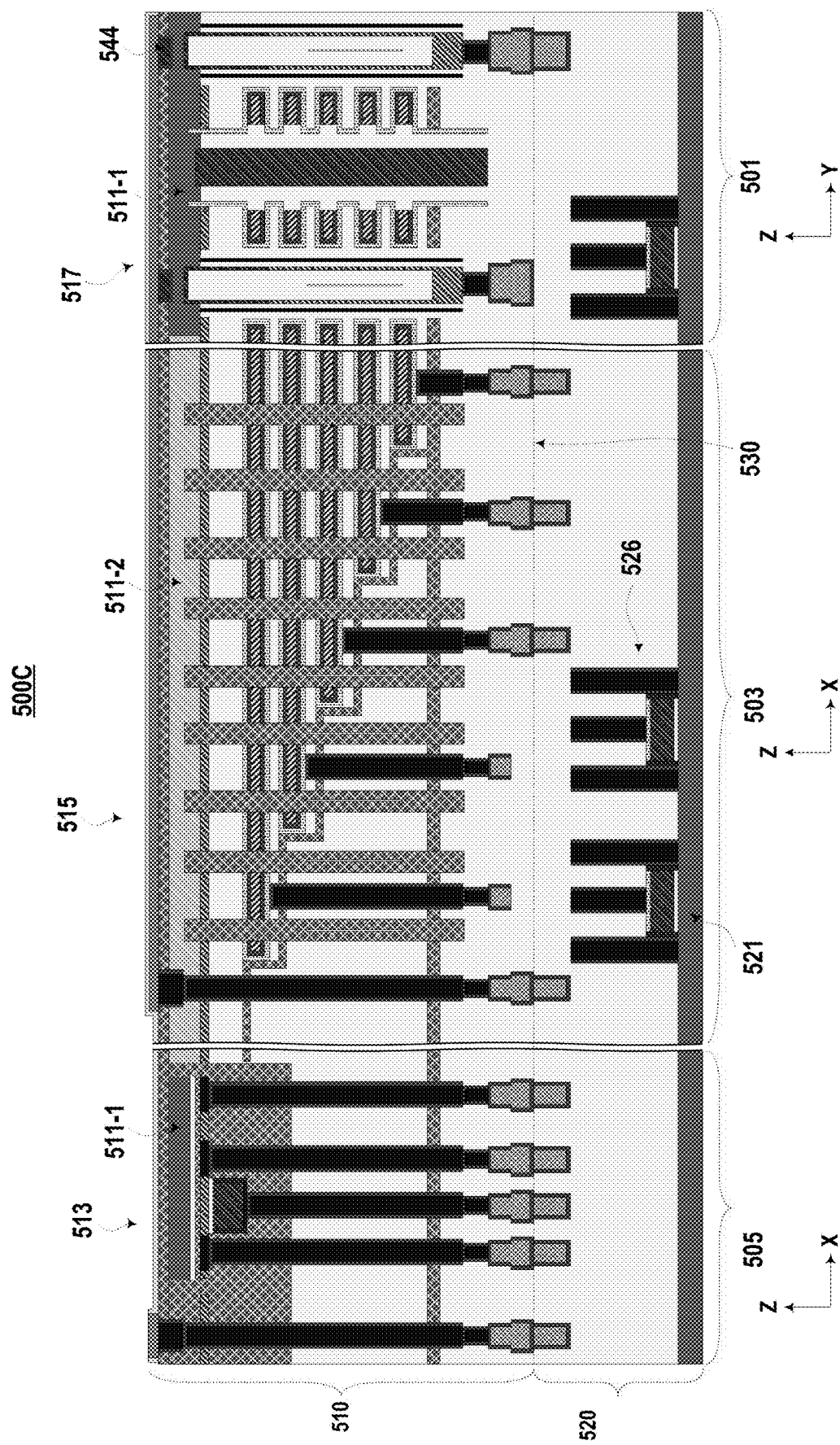
FIG. 5C illustrates a side view of a cross-section of an exemplary 3D memory device, according to some aspects of the present disclosure.

FIG. 5C illustrates a side view of a cross-section of an exemplary 3D memory device 500C, according to some aspects of the present disclosure. It is noted that X, Y, and Z axes are included in FIG. 5C to further illustrate the spatial relationship of the components in 3D memory device 500C. The cross-sectional view of core region 501 is along AA' direction of FIG. 5A or 5B, cross-sectional view of staircase region 503 is along BB' direction of FIG. 5A or 5B, and cross-sectional view of periphery region 505 is along CC' direction of FIG. 5A or 5B.

As shown in FIG. 5C, in some implementations, 3D memory device 500C is a bonded chip including a first semiconductor structure 510 and a second semiconductor structure 520 stacked over first semiconductor structure 510. First and second semiconductor structures 510 and 520 are jointed at a bonding interface 530 therebetween, according to some implementations.

As shown in FIG. 5C, first semiconductor structure 510 can include semiconductor layer 511, which can include silicon (e.g., single crystalline silicon, c-Si), silicon germanium (SiGe), gallium arsenide (GaAs), germanium (Ge), silicon-on-insulator (SOI), or any other suitable materials. In some implementations, semiconductor layer 511 can include polycrystalline silicon (polysilicon) layer 511-1 in core region 501 and in periphery region 505, and can include amorphous silicon layer 511-2 in staircase region 503.

First semiconductor structure 510 of 3D memory device 500C can include one or more first periphery circuits 513 on semiconductor layer 511 in one or more periphery regions 505. In some implementations, first periphery circuit 513 can include HV circuits 406 discussed above, and can include HV transistors located on polysilicon layer 511-1. In some other implementations, first periphery circuit 513 can further include LV circuits 404 discussed above, and can include LV transistors located on polysilicon layer 511-1. Isolation regions (e.g., shallow trench isolations (STIs), not shown) and doped regions (e.g., source regions and drain regions of the transistors) can be formed in polysilicon layer 511-1.

In some implementations, first semiconductor structure 510 of 3D memory device 100 further includes one or more arrays of memory cells 517 in one or more core regions 501, and one or more staircase structures 515 in one or more staircase regions 503. The structure of array of memory cells 517 and staircase structure 515 will be described in detail below.

As shown in FIG. 5C, first semiconductor structure 510 of 3D memory device 500C can further include a bonding layer at bonding interface 530 and above the interconnect layer. Bonding layer can include a plurality of bonding contact structures and dielectrics electrically isolating bonding contact structures. Bonding contact structures can include conductive materials including, but not limited to, W, Co, Cu, Al, silicides, or any combination thereof. The remaining area of bonding layer can be formed with dielectrics including, but not limited to, silicon oxide, silicon nitride, silicon oxynitride, low-k dielectrics, or any combination thereof. The bonding contact structures and surrounding dielectrics in bonding layer can be used for hybrid bonding.

As shown in FIG. 5C, second semiconductor structure 520 of 3D memory device 100 can include substrate 521, which can include silicon (e.g., single crystalline silicon, c-Si), silicon germanium (SiGe), gallium arsenide (GaAs), germanium (Ge), silicon-on-insulator (SOI), or any other suitable materials. Second semiconductor structure 520 of 3D memory device 500C can include second periphery circuit 526 on substrate 521. In some implementations, second periphery circuit 513 can include LLV circuits 402 discussed above, and can include LLV transistors located on substrate 521. In some other implementations, second periphery circuit 526 can further include LV circuits 404 discussed above, and can include LV transistors located on substrate 521. Although not shown in FIG. 5C, isolation regions (e.g., STIs) and doped regions (e.g., source regions and drain regions of the transistors) can be formed in substrate 521.

Similar to semiconductor structure 510, second semiconductor structure 520 of 3D memory device 500C can also include a bonding layer at bonding interface 530. Bonding layer can include a plurality of bonding contact structures and dielectrics electrically isolating bonding contact structures. Bonding contact structures can include conductive materials including, but not limited to, W, Co, Cu, Al, silicides, or any combination thereof. The remaining area of bonding layer can be formed with dielectrics including, but not limited to, silicon oxide, silicon nitride, silicon oxynitride, low-k dielectrics, or any combination thereof. Bonding contact structures and surrounding dielectrics in bonding layer can be used for hybrid bonding. Bonding contact structures are in contact with bonding contact structures at bonding interface 530, according to some implementations.

As shown in FIG. 5C, second semiconductor structure 520 can be bonded on top of first semiconductor structure 510 in a face-to-face manner at bonding interface 530. In some implementations, bonding interface 530 is a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 530 is the place at which first semiconductor structure 510 and second semiconductor structure 520 are met and bonded.

In some implementations, 3D memory device 500C is a NAND Flash memory device in which the array of memory cells 517 are provided in the form of an array of NAND memory strings. Each NAND memory string can include a respective channel structure. As shown in FIG. 5C, each channel structure can extend vertically through a plurality of pairs each including a stack conductive layer and a stack dielectric layer. The interleaved stack conductive layers and stack dielectric layers are part of memory stack. The number of the pairs of stack conductive layers and stack dielectric layers in memory stack determines the number of memory cells in 3D memory device 500C. It is understood that in some implementations, memory stack may have a staircase structure, which includes a plurality of memory decks stacked over one another. The numbers of the pairs of stack conductive layers and stack dielectric layers in each memory deck can be the same or different.

Memory stack can include a plurality of interleaved stack conductive layers and stack dielectric layers. Stack conductive layers and stack dielectric layers in memory stack can alternate in the vertical direction. In other words, except for the ones at the top or bottom of memory stack, each stack conductive layer can be adjoined by two stack dielectric layers on both sides, and each stack dielectric layer can be adjoined by two stack conductive layers on both sides. Stack conductive layers can include conductive materials including, but not limited to, W, Co, Cu, Al, polysilicon, doped silicon, silicides, or any combination thereof. Each stack conductive layer can include a gate electrode (gate line) surrounded by an adhesive layer and a gate dielectric layer. The gate electrode of stack conductive layer can extend laterally as a word line, ending at one or more staircase structures of memory stack. Stack dielectric layers can include dielectric materials including, but not limited to, silicon oxide, silicon nitride, silicon oxynitride, or any combination thereof.

In some implementations, each channel structure can have a cylinder shape (e.g., a pillar shape), and can extend vertically through interleaved stack conductive layers and stack dielectric layers of memory stack and in contact with semiconductor layer 511. Each channel structure includes a channel hole filled with a composite functional layer, a semiconductor channel, and a capping structure that are arranged radially from the center toward the outer surface of the pillar in this order, according to some implementations. The capping structure can include dielectric materials, such as silicon oxide, and/or an air gap. The composite functional layer can radially circumscribe the semiconductor channel along the lateral direction. A composite functional layer can be formed laterally between the semiconductor channel and memory stack. In some implementations, the semiconductor channel includes silicon, such as amorphous silicon, polysilicon, or single crystalline silicon. In some implementations, the semiconductor channel can include a doped portion and an undoped portion. As described below with respect to the fabrication process, from the fabrication process perspective, in some implementations, the doped portion of the semiconductor channel extends beyond memory stack and into semiconductor layer 511.

In some implementations, first semiconductor structure 510 of 3D memory device 500C further includes an interconnect layer (not shown) above first periphery circuits 513, staircase structure 515, and memory stack to transfer electrical signals to periphery circuits. The interconnect layer can include a plurality of interconnects (also referred to herein as contact structures), including lateral interconnect lines and vertical interconnect access (VIA) contact structures. As used herein, the term interconnects can broadly include any suitable types of interconnects, such as middle-end-of-line (MEOL) interconnects and back-end-of-line (BEOL) interconnects. The interconnect layer can further include one or more interlayer dielectric (ILD) layers (a.k.a. intermetal dielectric (IMD) layers) in which the interconnect lines and VIA contact structures can form. That is, the interconnect layer can include interconnect lines and VIA contact structures in multiple ILD layers. The interconnect lines and VIA contact structures in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

Instead of the front side contact structures/pads, 3D memory device 500C can include one or more backside contact structures/pads 544 above and in contact with doped semiconductor layer 511, as shown in FIG. 5C. Contact structures/pads 544 and memory stack can be disposed at opposite sides of doped semiconductor layer 511 and thus, viewed as a "backside" contact structures/pads. In some implementations, contact structures/pads 544 can be formed by any suitable BEOL method and electrically connected to the semiconductor channel of channel structures through doped semiconductor layer 511. Contact structures/pads 544 can include any suitable types of contact structures and/or pads. In some implementations, contact structures/pads 544 can include a VIA contact, a wall-shaped contact extending laterally, one or more conductive layers, such as a metal layer (e.g., W, Co, Cu, or Al) or a silicide layer surrounded by an adhesive layer (e.g., titanium nitride (TiN)), etc. In some implementations, one or more contact structures/pads 544 may further include a spacer (e.g., a dielectric layer) to electrically separate the one or more contact structures/pads 544 from doped semiconductor layer 511.

In some implementations, 3D memory device 500C further includes periphery contact structures each extending vertically in periphery region 505. In some implementations, the periphery contact can be in contact with transistors of first periphery circuit 513. Periphery contact structures each can include one or more conductive layers, such as a metal layer (e.g., W, Co, Cu, or Al) or a silicide layer surrounded by an adhesive layer (e.g., TiN). In some implementations, 3D memory device 500C further includes a variety of local contact structures (also known as "C1"), which are in contact with a structure in memory stack directly. In some implementations, the local contact structures include channel local contact structures each below and in contact with the lower end of respective channel structure. Each channel local contact can be electrically connected to a bit line contact (not shown) for bit line fan-out. In some implementations, the local contact structures further include word line local contact structures each below and in contact with respective stack conductive layer (including a word line) at the staircase structure of memory stack for word line fan-out. Local contact structures, such as channel local contact structures and word line local contact structures, can be electrically connected to first periphery circuit 513 and/or second periphery circuit 526 through interconnect structures. Local contact structures, such as channel local contact structures and word line local contact structures, each can include one or more conductive layers, such as a metal layer (e.g., W, Co, Cu, or Al) or a silicide layer surrounded by an adhesive layer (e.g., TiN).

Although an exemplary 3D memory device 500C is shown in FIG. 5C, it is understood that by varying the relative positions of first and second semiconductor structures 510 and 520, the usage of various interconnects, contact structures, and/or the pad-out locations (e.g., through first semiconductor structure 510 and/or second semiconductor structure 520), any other suitable architectures of 3D memory devices may be applicable in the present disclosure without further detailed elaboration.

Figure 6:
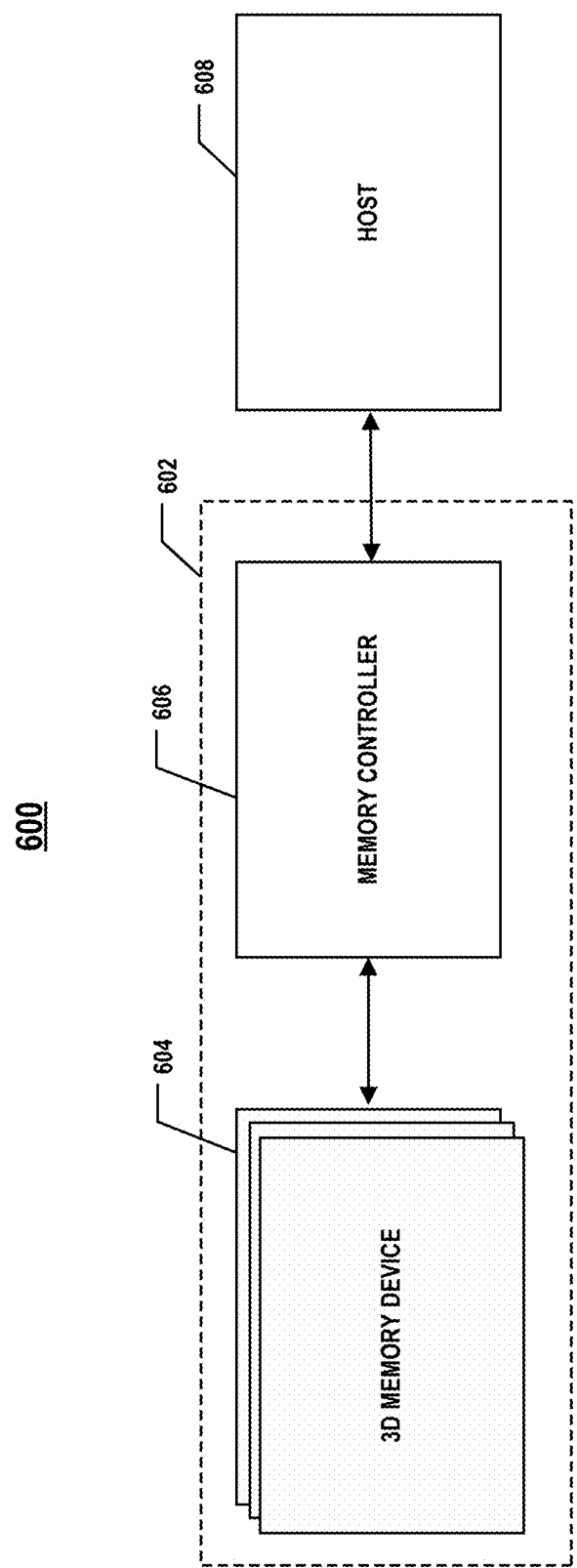
FIG. 6 illustrates a block diagram of an exemplary system having a 3D memory device, according to some aspects of the present disclosure.

FIG. 6 illustrates a block diagram of an exemplary system 600 having a 3D memory device, according to some aspects of the present disclosure. System 600 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 6, system 600 can include a host 608 and a memory system 602 having one or more 3D memory devices 604 and a memory controller 606. Host 608 can be a processor of an electronic device, such as a central processing unit (CPU), or a system-on-chip (SoC), such as an application processor (AP). Host 608 can be configured to send or receive data to or from 3D memory devices 604.

3D memory device 604 can be any 3D memory devices disclosed herein, such as 3D memory devices 100 and 400 shown in FIGS. 1 and 4B. In some implementations, each 3D memory device 604 includes a NAND Flash memory. Consistent with the scope of the present disclosure, the semiconductor channel of 3D memory device 604 can be partially doped such that part of the semiconductor channel that forms the source contact is highly doped to lower the potential barrier while leaving another part of the semiconductor channel that forms the memory cells remaining undoped or lowly doped. One end of each channel structure of 3D memory device 604 can be opened from the backside to expose the doped part of the respective semiconductor channel. 3D memory device 604 can further include a doped semiconductor layer electrically connecting the exposed doped parts of the semiconductor channels to further reduce the contact resistance and sheet resistance. Moreover, 3D memory device 604 can include a composite dielectric film having a gate dielectric portion that faces the source select gate line(s). The gate dielectric portion can be free of silicon nitride (e.g., including only silicon oxide) and act as the gate dielectric of the SSG transistor. As a result, the electric performance of 3D memory device 604 can be improved, which in turn improves the performance of memory system 602 and system 600, e.g., achieving higher operation speed.

Memory controller 606 (a.k.a., a controller circuit) is coupled to 3D memory device 604 and host 608 and is configured to control 3D memory device 604, according to some implementations. Memory controller 606 can manage the data stored in 3D memory device 604 and communicate with host 608. In some implementations, memory controller 606 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 606 is designed for operating in a high duty-cycle environment SSDs or embedded multimedia-cards (eMMCs) used as data storage for mobile devices, such as smartphones, tablets, laptop computers, etc., and enterprise storage arrays. Memory controller 606 can be configured to control operations of 3D memory device 604, such as read, erase, and program operations. Memory controller 606 can also be configured to manage various functions with respect to the data stored or to be stored in 3D memory device 604 including, but not limited to bad-block management, garbage collection, logical-to-physical address conversion, wear leveling, etc. In some implementations, memory controller 606 is further configured to process error correction codes (ECCs) with respect to the data read from or written to 3D memory device 604. Any other suitable functions may be performed by memory controller 606 as well, for example, formatting 3D memory device 604. Memory controller 606 can communicate with an external device (e.g., host 608) according to a particular communication protocol. For example, memory controller 606 may communicate with the external device through at least one of various interface protocols, such as a USB protocol, an MMC protocol, a periphery component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 7:
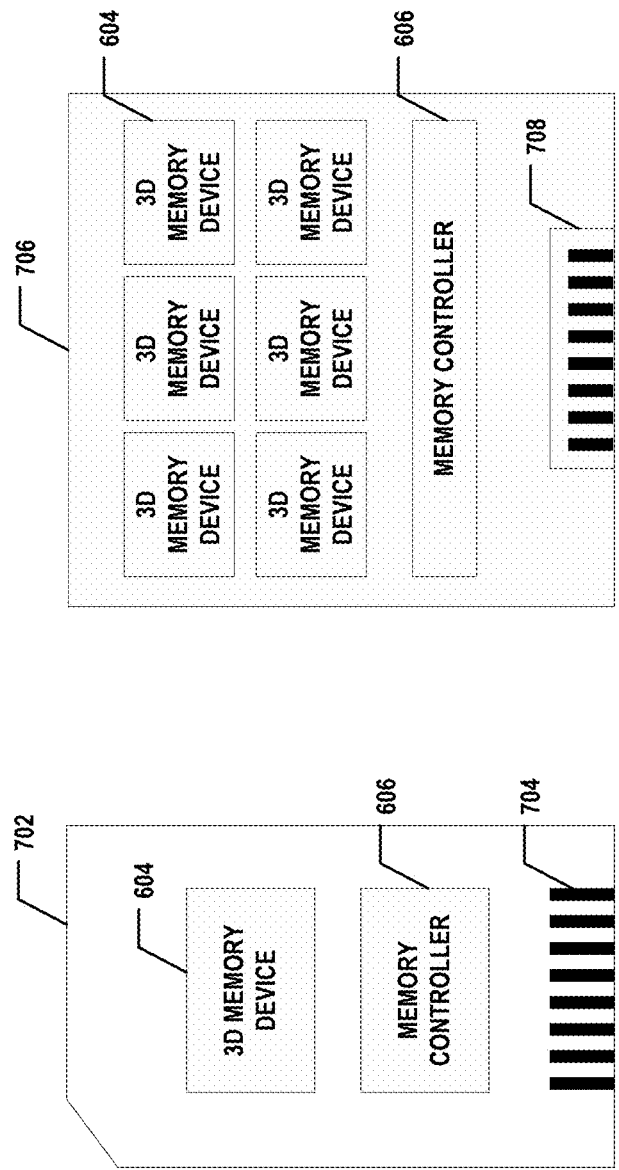
FIG. 7A illustrates a diagram of an exemplary memory card having a 3D memory device, according to some aspects of the present disclosure.
FIG. 7B illustrates a diagram of an exemplary solid-state drive (SSD) having a 3D memory device, according to some aspects of the present disclosure.

Memory controller 606 and one or more 3D memory devices 604 can be integrated into various types of storage devices, for example, be included in the same package, such as a universal Flash storage (UFS) package or an eMMC package. That is, memory system 602 can be implemented and packaged into different types of end electronic products. In one example as shown in FIG. 7A, memory controller 606 and a single 3D memory device 604 may be integrated into a memory card 702. Memory card 702 can include a PC card (PCMCIA, personal computer memory card international association), a CF card, a smart media (SM) card, a memory stick, a multimedia card (MMC, MMCmicro), an SD card (SD, miniSD, microSD, SDHC), a UFS, etc. Memory card 702 can further include a memory card connector 704 electrically coupling memory card 702 with a host (e.g., host 608 in FIG. 7). In another example as shown in FIG. 8B, memory controller 606 and multiple 3D memory devices 604 may be integrated into an SSD 706. SSD 706 can further include an SSD connector 708 electrically coupling SSD 706 with a host (e.g., host 608 in FIG. 7). In some implementations, the storage capacity and/or the operation speed of SSD 706 is greater than those of memory card 702.

Figure 8:
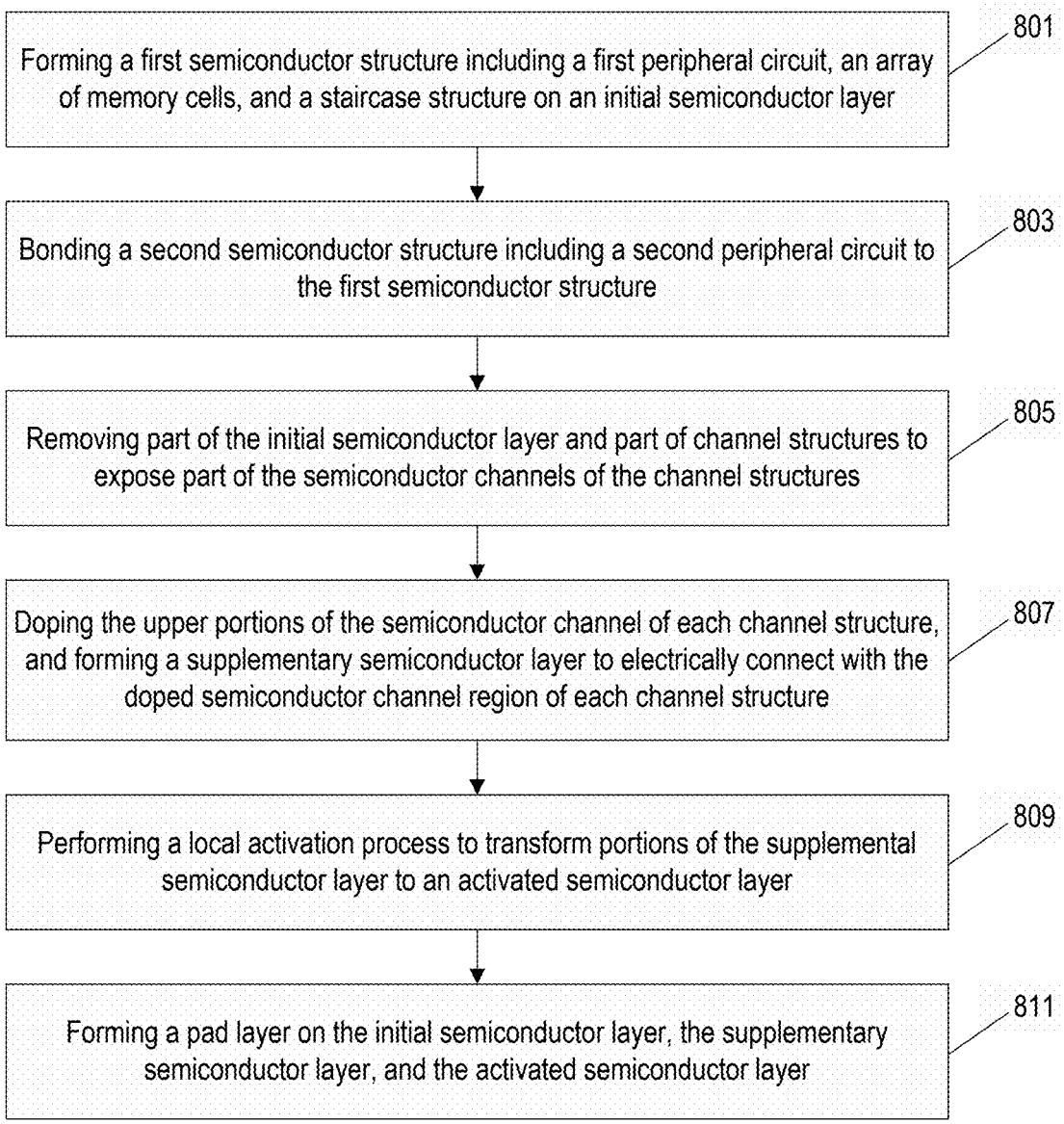
FIG. 8 illustrates a flow diagram of an exemplary method for forming a 3D memory device, according to s some aspects of the present disclosure.

Referring to FIG. 8, a flow diagram of an exemplary method 800 for forming a 3D memory device is illustrated in accordance with some implementations of the present disclosure. It should be understood that the operations shown in FIG. 8 are not exhaustive and that other operations can be performed as well before, after, or between any of the illustrated operations. Further, some of the operations may be performed simultaneously, or in a different order than shown in FIG. 8. FIGS. 8-18 illustrate schematic cross-sectional views of an exemplary 3D memory device at certain fabricating stages of method 800 shown in FIG. 8 according to some implementations of the present disclosure.

Referring to FIG. 8, method 800 can start at operation 801, in which a first semiconductor structure can be provided. In some implementations, the first semiconductor structure can include one or more arrays of memory cells in one or more core regions, one or more staircase structures in one or more staircase regions, and one or more first periphery circuits in one or more periphery regions.

Figure 9:
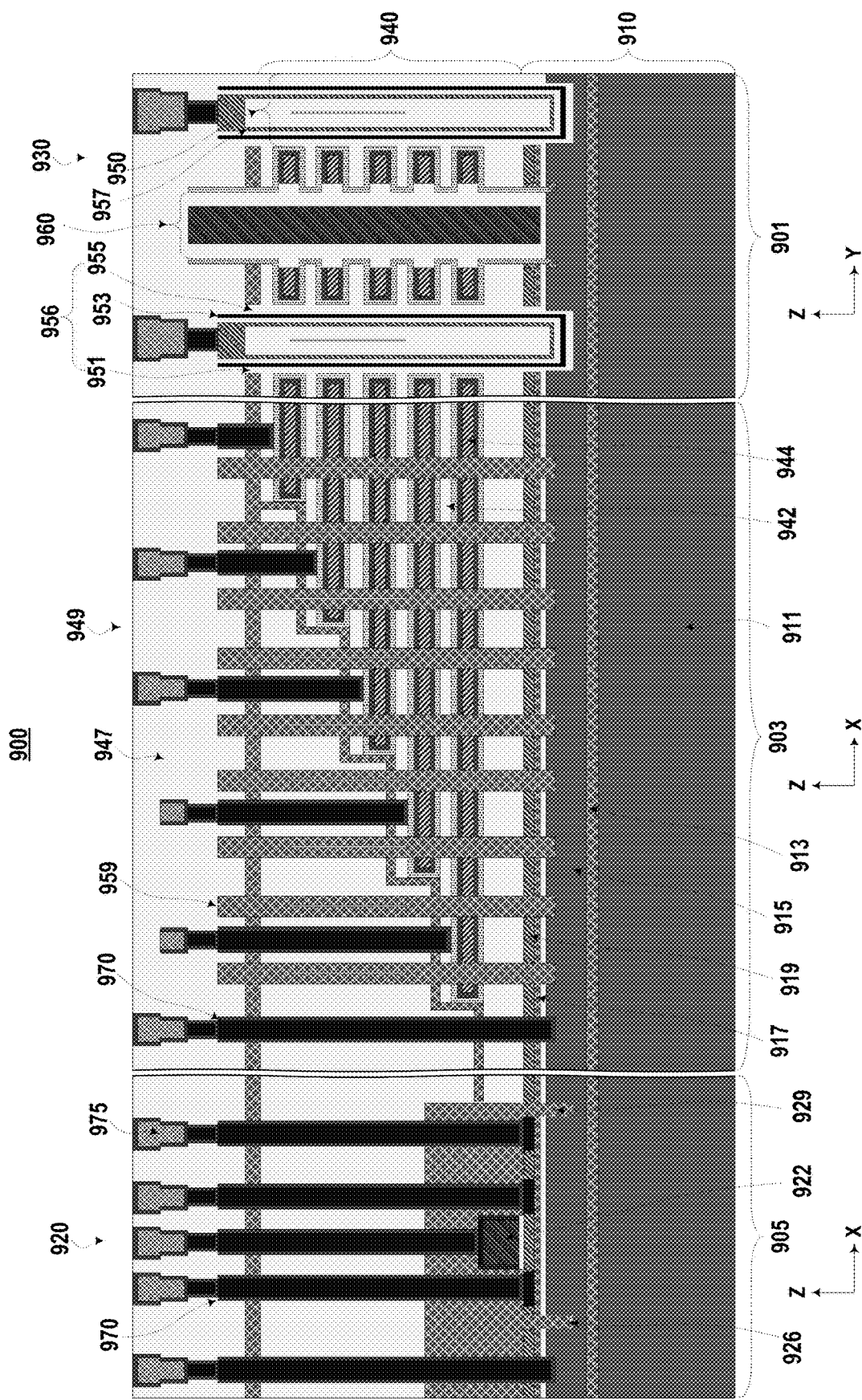
FIGS. 9-18 illustrate schematic cross-sectional views of an exemplary 3D memory device at certain fabricating stages of the method shown in FIG. 8, according to some aspects of the present disclosure.

As shown in FIG. 9, in some implementations, array of memory cells 930, staircase structure 949, and first periphery circuit 920 can be formed on a first substrate 910. In some implementations, first substrate 910 can be a stack structure including a sacrificial substrate 911, a first stop layer 913, an initial semiconductor layer 915, a second stop layer 917, and a semiconductor film 919. Sacrificial substrate 911 can be any suitable carrier substrate, such as a silicon substrate or a carrier substrate, made of any suitable materials, such as glass, sapphire, plastic, to name a few, to reduce the cost of the substrate. First stop layer 913 can be formed above sacrificial substrate 911, and can act as a chemical mechanical polishing (CMP)/etch stop layer when removing sacrificial substrate 911 in subsequent process from the backside and thus, may include any suitable materials other than the material of sacrificial substrate 911, such as silicon nitride or silicon oxide. Initial semiconductor layer 915 can be formed to cover first stop layer 913. In some implementations, initial semiconductor layer 915 can include silicon. Second stop layer 917 is formed to cover initial semiconductor layer 915. Second stop layer 917 can act as an etch stop layer when removing portions of initial semiconductor layer 915 from the backside and thus, may include any suitable materials other than the material of initial semiconductor layer 915, such as silicon nitride or silicon oxide. Semiconductor film 919 including single crystalline silicon is formed on second stop layer 917.

In some implementations, first substrate 910 including sacrificial substrate 911, first stop layer 913, initial semiconductor layer 915, second stop layer 917, and semiconductor film 919 can be sequentially formed using one or more thin film deposition processes including, but not limited to, Chemical Vapor Deposition (CVD), Physical Vapor Deposition (PVD), Atomic Layer Deposition (ALD), or any combination thereof. It is understood that in some examples, pad oxide layers (e.g., silicon oxide layers, not shown) may be formed between sacrificial substrate 911, first stop layer 913, initial semiconductor layer 915, second stop layer 917, and semiconductor film 919 to relax the stress between different layers and avoid peeling. In some implementations, a spacer structure 929 is formed to separate a first portion of semiconductor film 919 in periphery region 905 and a second portion of semiconductor film 919 in staircase region 903 and core region 901.

In some implementations, one or more first periphery circuits 920 can be formed in periphery region 905 using a plurality of processes including, but not limited to, photolithography, etching, thin film deposition, thermal growth, implantation, CMP, and any other suitable processes. In some implementations, first periphery circuit 920 includes a plurality of transistors 922 that are separated from each other by STIs 926 formed by wet etching and/or dry etching and thin film deposition. In some implementations, first periphery circuit 920 includes HV circuits 406, and transistors 922 can include HV transistors. In some implementations, first periphery circuit 920 further includes LV circuits 404, transistors 922 can further include LV transistors. In some implementations, doped regions (e.g., wells, sources, and drains of transistors 922) can be formed in semiconductor film 919 by ion implantation and/or thermal diffusion, which function, for example, as source regions and/or drain regions of transistors 922. Corresponding transistor contact structures (e.g., gate contact, source contact, and drain contact) can be formed on first substrate 910.

As illustrated in FIG. 9, in some implementations, a memory stack 940 including interleaved stack dielectric layers 942 and stack gate structures 944 can be formed on first substrate 910. Stack dielectric layers 942 and stack gate structures 944 can be alternatingly disposed on first substrate 910. In some implementations, each stack dielectric layer 942 includes a layer of silicon oxide, and each stack gate structure 944 includes a gate electrode (also referred to as stack conductive layer) wrapped by one or more insulating films. The gate electrode can include any suitable conductive material, e.g., tungsten, aluminum, copper, cobalt, or any combination thereof, for acting as a word line. The insulating films can be used as one or more gate dielectric layers for insulating the respective word line (i.e., gate electrode). Memory stack 940 can be converted from a dielectric stack structure by using a gate replacement process, in which a plurality of stack sacrificial layers in the dielectric stack structure are replaced by a plurality of stack gate structures 944.

As illustrated in FIG. 9, memory stack 940 can include one or more staircase structures 949 in one or more staircase regions 903. The staircase structure can be formed by performing a plurality of so-called "trim-etch" cycles to the dielectric stack structure and the following gate replacement process. Staircase structure 949 can have one or more tilted edges for convenient wiring to respective word lines (i.e., gate electrodes) in different layers of memory stack 940. A staircase insulating layer can be formed to cover the staircase structure 949. In some implementations, a plurality of dummy channel structures 959 can be formed in staircase region 903 and extending through and beyond staircase structure 949. In some implementations, dummy channel structures 959 can include any suitable dielectric material, such as $SiO_2$, to provide mechanical support for the 3D memory device.

As illustrated in FIG. 9, array of memory cells 930 can include plurality of channel structures 950 formed in core region 901. Each channel structure 950 can vertically extend through and beyond memory stack 940, and can include functional layer 956 and semiconductor channel 957. In some implementations, functional layer 956 is a composite dielectric layer including a blocking layer 951, a storage layer 953, and a tunneling layer 955.

Processes to form the channel structure 950 can include forming a channel hole extending through memory stack 940 and partially into first substrate 910. In some implementations, a plurality of channel holes are formed, such that each channel hole becomes the location for growing an individual channel structure 950. In some implementations, fabrication processes for forming the channel holes of channel structures 950 include wet etching and/or dry etching. As illustrated in FIG. 9, blocking layer 951, storage layer 953, tunneling layer 955, and semiconductor channel 957 are sequentially formed in this order along sidewalls and the bottom surface of each channel hole. In some implementations, blocking layer 951, storage layer 953, and tunneling layer 955 are first deposited along the sidewalls and bottom surface of the channel hole in this order using one or more thin film deposition processes, such as ALD, CVD, PVD, any other suitable processes, or any combination thereof, to form the memory film. Semiconductor channel 957 then can be formed by depositing a semiconductor material, such as polysilicon (e.g., undoped polysilicon), using one or more thin film deposition processes, such as ALD, CVD, PVD, any other suitable processes, or any combination thereof. In some implementations, a first silicon oxide layer, a silicon nitride layer, a second silicon oxide layer, and a polysilicon layer (an "ONOS" structure) are sequentially deposited to form blocking layer 951, storage layer 953, tunneling layer 955, and semiconductor channel 957.

As shown in the cross-sectional view of core region 901 in Y-Z plane in FIG. 9, in some implementations, one or more slit structure 960 can vertically penetrate through memory stack 940, and can extend laterally in a straight line along a word line direction (i.e., X direction) between two groups of channel structures 950. Slit structure 960 can include a dielectric wall or a conductive wall (e.g., acting as an array common source (ACS)) sandwiched by gate line spacer (GLSP) layers. In some implementations, a filling insulating structure 947 can be formed to cover first periphery circuit 920, staircase structure 949, memory stack 940, channel structures 950, and dummy channel structures 959. A CMP process can be performed to planarize the top surface of filling insulating structure 947.

As shown in FIG. 9, a plurality of contact structures 970, including channel structure contact structures, word line contact structures, periphery contact structures, and/or ACS contact structures can be formed in filling insulating structure 947. In some implementations, a plurality of channel structure contact structures can be formed in core region 901, a plurality of word line contact structures can be formed in staircase region 903, and a plurality of periphery contact structures can be formed in periphery region 905. In some implementations, an end (e.g., the upper end) of each contact structure 970 can be flush with one another. Another end (e.g., the lower end) of each contact structure 970 can be in contact with the respective contact structure. For example, the lower end of each channel structure contact can be in contact with corresponding channel layer 957 in channel structure 950, the lower end of each word line contact can be in contact with corresponding gate electrode (word line) in one level of staircase structure 949, and the lower end of each periphery contact can be in contact with corresponding periphery circuit contact (e.g., source contact, drain contact, gate contact, etc.).

It is understood that, a fabricating process for forming the plurality of contact structures 970 can include multiple processes, for example, photolithography, etching, thin film deposition, and CMP. For example, the plurality of contact structures 970 can be formed through the filling insulating structure 947 by first deep etching vertical openings (e.g., by wet etching and/or dry etching), followed by filling the vertical openings with conductor materials using ALD, CVD, PVD, any other suitable processes, or any combination thereof. The conductor materials used for filling the vertical openings can include, but are not limited to, W, Co, Cu, Al, polysilicon, silicides, or any combination thereof. In some implementations, other conductor materials are also used to fill the openings to function as a barrier layer, an adhesion layer, and/or a seed layer. In some implementations, the plurality of channel structure contact structures, word line contact structures, periphery contact structures, and/or the one or more ACS contact structures, can be simultaneously formed in the same contact forming process.

As shown in FIG. 9, a plurality of first interconnect contact structures 975 can be formed in filling insulating structure 947. The upper end of each first interconnect contact structures 975 can be flush with one another at the top surface of filling insulating structure 947, and the lower end of each first interconnect contact 975 can be flush with one another and in contact with an upper end of a corresponding contact structure 970. A plurality of first interconnect contact structures 975 can be formed in filling insulating structure 947 by first etching vertical openings (e.g., by wet etching and/or dry etching), followed by filling the openings with conductor materials using ALD, CVD, PVD, any other suitable processes, or any combination thereof. The conductor materials used to form first interconnect contact structures 975 can include, but are not limited to, W, Co, Cu, Al, polysilicon, silicides, or any combination thereof. In some implementations, other conductor materials are used to fill the openings to function as a barrier layer, an adhesion layer, and/or a seed layer. In some implementations, each first interconnect contact 975 can include multiple sub-contact structures formed in the multiple sub-layers. For example, the multiple sub-contact structures can include one or more contact structures, single-layer/multi-layer vias, conductive lines, plugs, pads, and/or any other suitable conductive structures, and can be formed in multiple contact-forming processes. For example, fabrication processes to form the multiple sub-contact structures can include forming one or more conductive layers and one or more contact layers in the corresponding sub-layers of filling insulating structure 947. The conductive layers and the conductor contact layers can be formed by any suitable known back-end-of-line (BEOL) methods. In some implementations, all first interconnect contact structures 975 can be simultaneously formed in the same contact forming processes. In some implementations, first interconnect contact structures 975 can be used for connecting contact structure 970 in subsequent processes.

Referring back to FIG. 8, method 800 proceed to operation 803, in which a second semiconductor structure can be bonded to the first semiconductor structure. The second semiconductor structure can include a second periphery circuit and a plurality of second interconnect contact structures on a second substrate. The first semiconductor structure and the second semiconductor structure are bonded in a face-to-face manner.

In some implementations, second substrate 1010 can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 10:
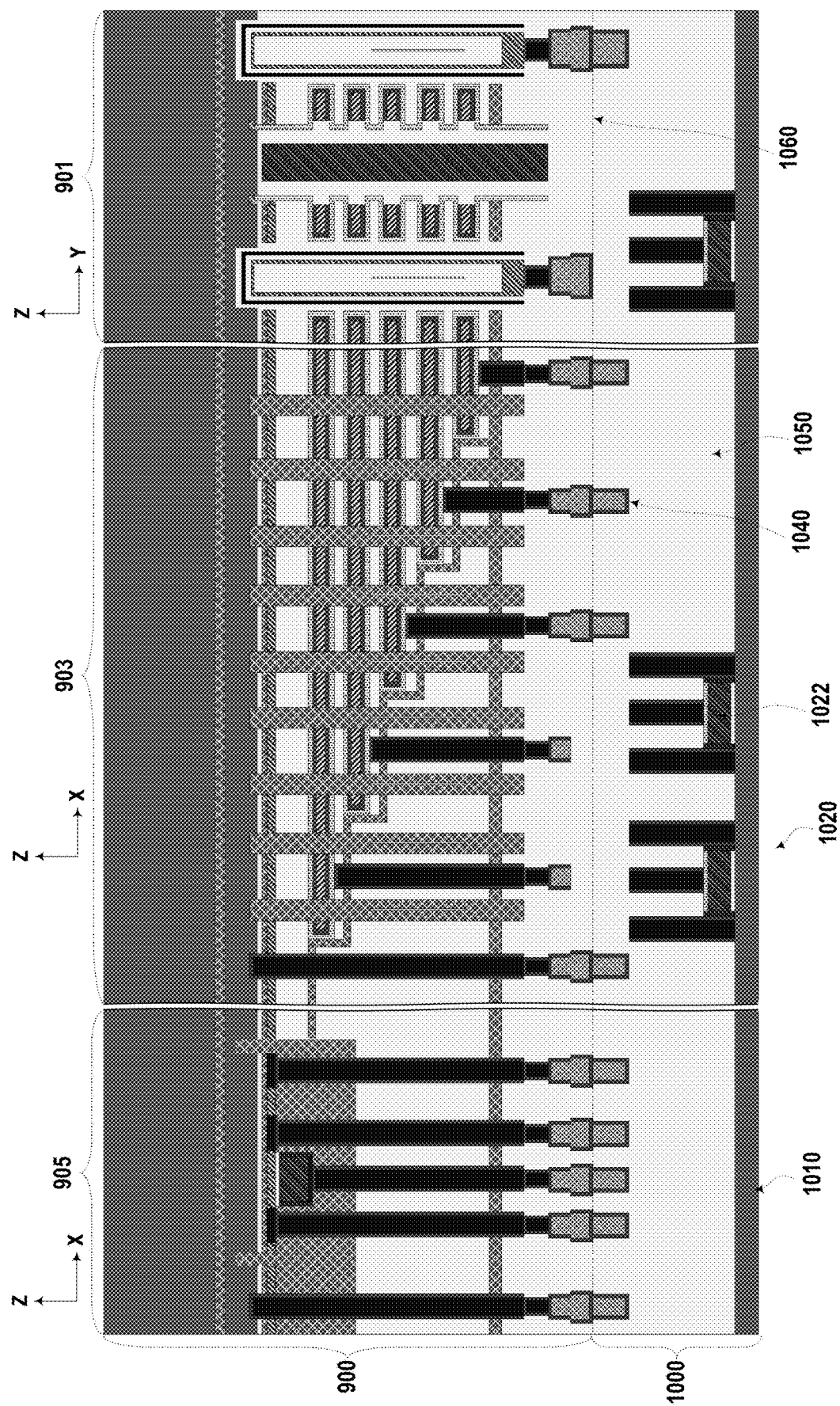

In some implementations, as illustrated in FIG. 10, second periphery circuit 1020 can be formed on second substrate 1010 using a plurality of processes including, but not limited to, photolithography, etching, thin film deposition, thermal growth, implantation, chemical mechanical polishing (CMP), and any other suitable processes. In some implementations, second periphery circuit 1020 includes a plurality of transistors 1022 that are separated from each other by STIs (not shown) formed by wet etching and/or dry etching and thin film deposition. In some implementations, second periphery circuit 1020 includes LLV circuits 402, and transistors 1022 include LLV transistors. In some implementations, second periphery circuit 1020 includes LLV circuits 402 and LV circuits 404, and transistors 1022 further include LV transistors. In some implementations, doped regions (e.g., wells, sources, and drains of transistors 1022, not shown) can be formed on or in second substrate 1010 by ion implantation and/or thermal diffusion, which function, for example, as source regions and/or drain regions of transistors 1022. Corresponding transistor contact structures (e.g., gate contact, source contact, and drain contact) can be formed in an insulating layer 1050 covering second substrate 1010.

In some implementations, insulating layer 1050 can include any suitable insulating material and/or dielectric material, such as silicon oxide, etc. In some implementations as shown in FIG. 10, insulating layer 1050 can be an oxide layer deposited on second substrate 1010 and covering second periphery circuit 1020.

A plurality of second interconnect contact structures 1040 can be formed through insulating layer 1050 by first etching vertical openings (e.g., by wet etching and/or dry etching), followed by filling the openings with conductor materials using ALD, CVD, PVD, any other suitable processes, or any combination thereof. The conductor materials used to form second interconnect contact structures 1040 can include, but are not limited to, W, Co, Cu, Al, polysilicon, silicides, or any combination thereof. In some implementations, other conductor materials are used to fill the openings to function as a barrier layer, an adhesion layer, and/or a seed layer. In some implementations, each second interconnect contact 1040 can include multiple sub-contact structures formed in the multiple sub-layers. For example, the multiple sub-contact structures can include one or more contact structures, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contact structures can include forming one or more conductive layers and one or more contact layers in the corresponding sub-layers of insulating layer 1050. The conductive layers and the conductor contact layers can be formed by any suitable known back-end-of-line (BEOL) methods. In some implementations, all second interconnect contact structures 1040 can be simultaneously formed in the same contact forming processes. In some implementations, second interconnect contact structures 1040 can be used for connecting transistors 1022 in subsequent processes.

The bonding can include hybrid bonding. As illustrated in FIG. 10, first semiconductor structure 900 can be flipped upside down. As such, first semiconductor structure 900 and second semiconductor structure 1000 can be bonded together in a face-to-face manner at bonding interface 1060, according to some implementations. In some implementations, a treatment process, e.g., a plasma treatment, a wet treatment, and/or a thermal treatment, is applied to the bonding surfaces of first semiconductor structure 900 and second semiconductor structure 1000 prior to the bonding. After the bonding, corresponding first inter interconnect contact structures 975 and second interconnect contact structures 1040 are aligned and in contact with one another, such that memory stack 940 and channel structures 950 can be electrically connected to first periphery circuit 920 and second periphery circuit 1020.

Referring back to FIG. 8, method 800 proceeds to operation 805, in which part of the first substrate and part of the channel structure are sequentially removed to expose part of the semiconductor channels of the channel structures. The removal can be performed from the backside of the first substrate.

Figure 11:
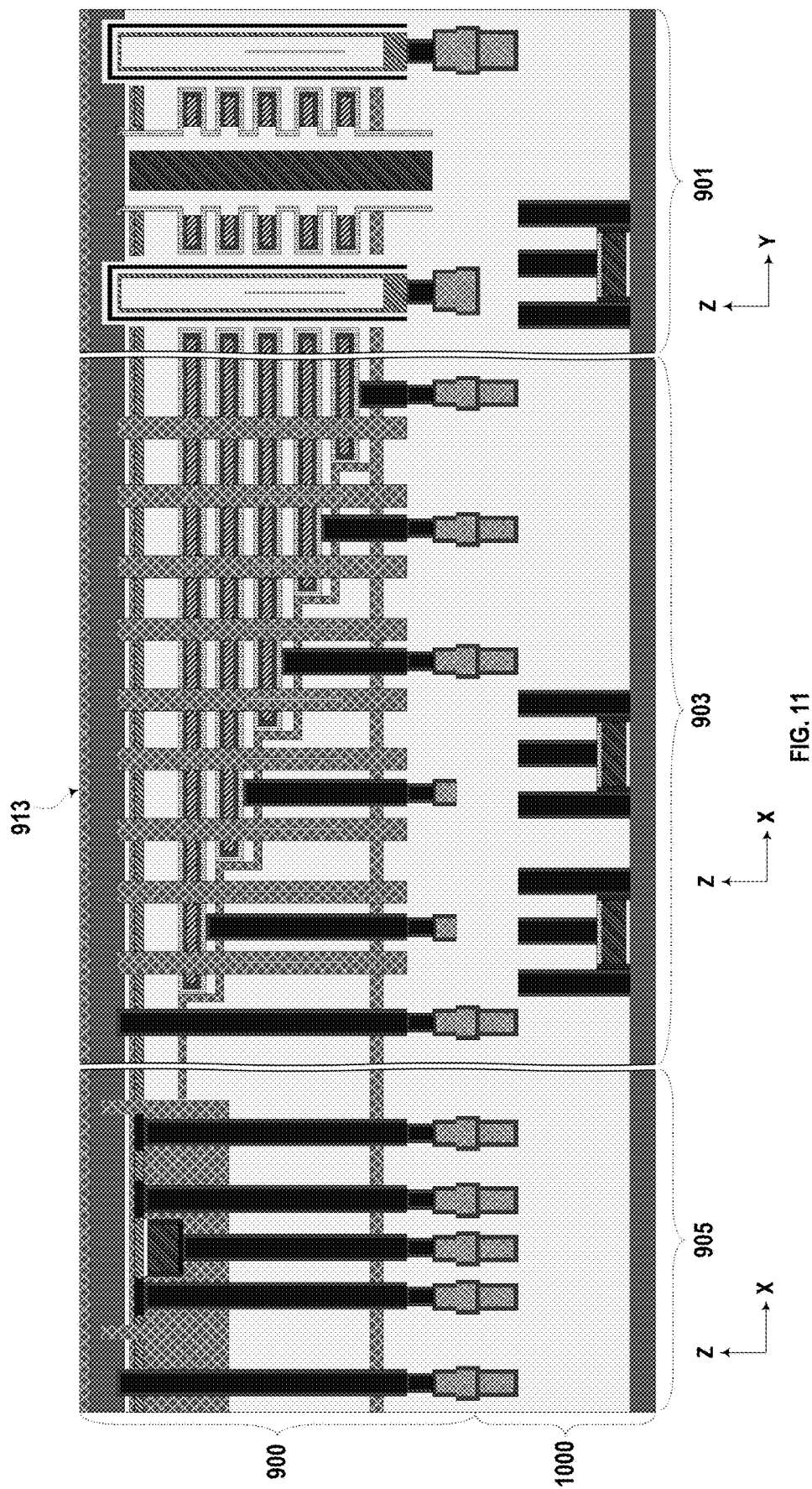

As shown in FIG. 11, in some implementations, sacrificial substrate 911 can be removed from the backside until being stopped by first stop layer 913. Sacrificial substrate 911 can be removed using CMP, grinding, dry etching, and/or wet etching. In some implementations in which sacrificial substrate 911 includes silicon and first stop layer 913 includes silicon nitride, sacrificial substrate 911 can be removed using silicon CMP, which can be automatically stopped when reaching first stop layer 913 having materials other than silicon, i.e., acting as a backside CMP stop layer. In some implementations, sacrificial substrate 911 can be removed using wet etching by tetramethylammonium hydroxide (TMAH), which is automatically stopped when reaching first stop layer 913 having materials other than silicon, i.e., acting as a backside etch stop layer.

Figure 12:
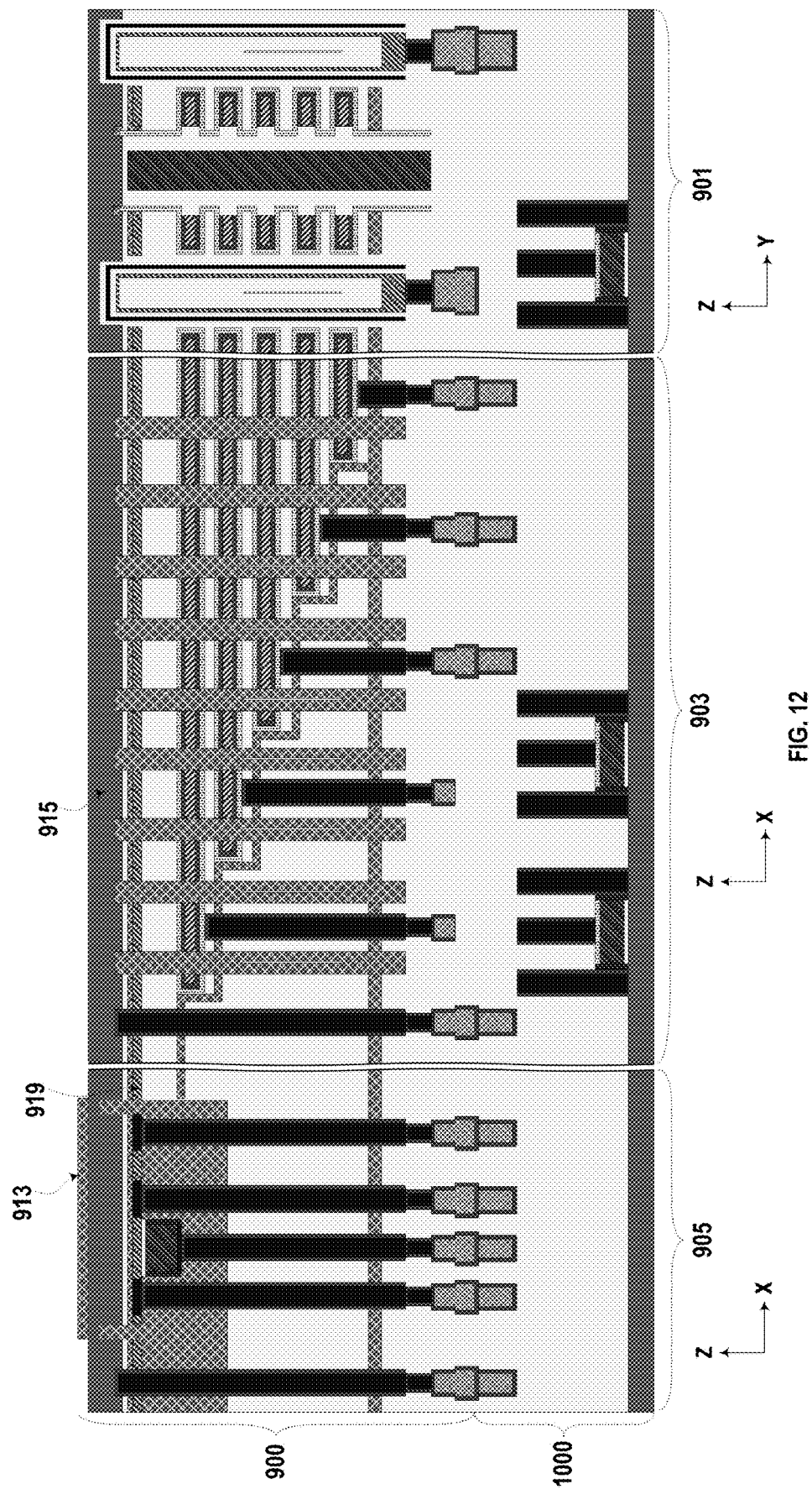

As shown in FIG. 12, in some implementations, after removing sacrificial substrate 911, portions of first stop layer 913 can be removed to expose portions of initial semiconductor layer 915 in core region 901 and staircase region 903. In some implementations, the portions of first stop layer 913 can be removed using wet etching with suitable etchants, such as phosphoric acid and hydrofluoric acid, until being stopped by initial semiconductor layer 915 having a different material (e.g., silicon) from the material of first stop layer 913. As such, portions of initial semiconductor layer 915 in core region 901 and staircase region 903 can be exposed as shown in FIG. 12. The remaining portions of first stop layer 913 can cover portions of initial semiconductor layer 915 corresponding to transistors 922 of first periphery circuit 920, and used to protect the portions of initial semiconductor layer 915 in periphery region 905 in the subsequent processes. It is noted that, in some other implementations not shown in the figures, the entire first stop layer 913 can be removed. That is, initial semiconductor layer 915 can be exposed in periphery region 905 as long as semiconductor film 919 in periphery region 905 is covered and protected by initial semiconductor layer 915.

Figure 13:
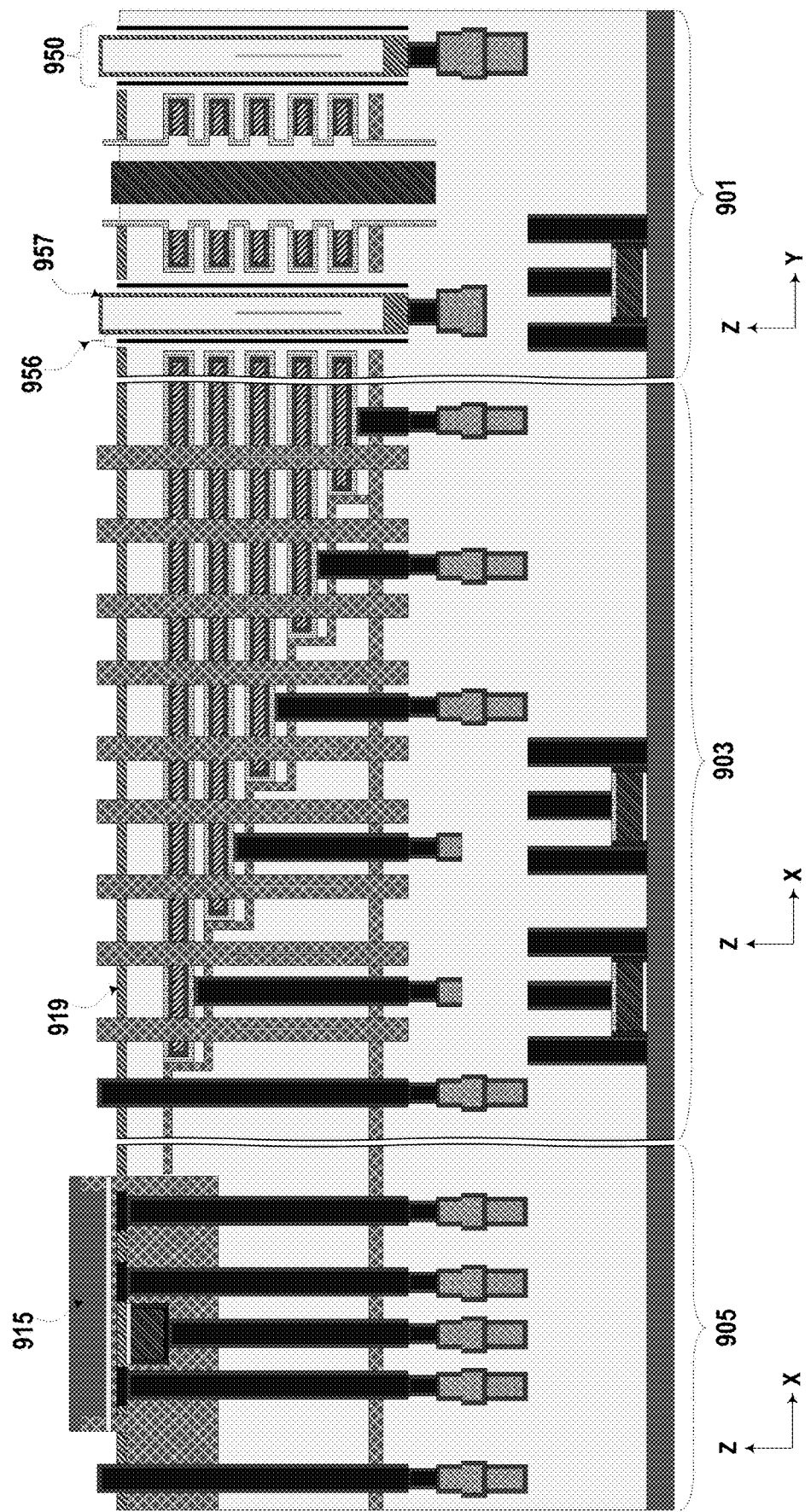

As shown in FIG. 13, in some implementations, portions of initial semiconductor layer 915 exposed in core region 901 and staircase region 903 can be removed. As such, portions of channel structure 950 can be exposed. For example, using the remaining portions of first stop layer 913 in periphery region 905 as a mask, portions of initial semiconductor layer 915 exposed in core region 901 and staircase region 903 can be completely removed by a selective wet etching, and stopping at second stop layer 917. Portions of channel structure 950 extended above second stop layer 917 can be exposed. After that, portions of functional layer 956 of each channel structure 950, portions of second stop layer 917 in core region 901 and staircase region 903, and the remaining portions of first stop layer 913 in periphery region 905 can be removed. For example, a selective wet etching process can be performed to simultaneously remove the portions of blocking layer 951, storage layer 953, and tunneling layer 955 that extend above semiconductor film 919, and second stop layer 917 in core region 901 and staircase region 903, and the remaining portions of first stop layer 913 in periphery region 905. The etching process can be controlled by controlling the etching time and/or etching rate, such that the etching does not continue beyond semiconductor film 919 into memory stack 970. As such, an upper portion of semiconductor channel 957 of each channel structure 950 can be exposed.

Referring back to FIG. 8, method 800 proceeds to operation 807, in which the upper portions of the semiconductor channel of each channel structure can be doped, and a supplemental semiconductor layer can be formed to electrically connect with the doped semiconductor channel of each channel structure.

Figure 14:
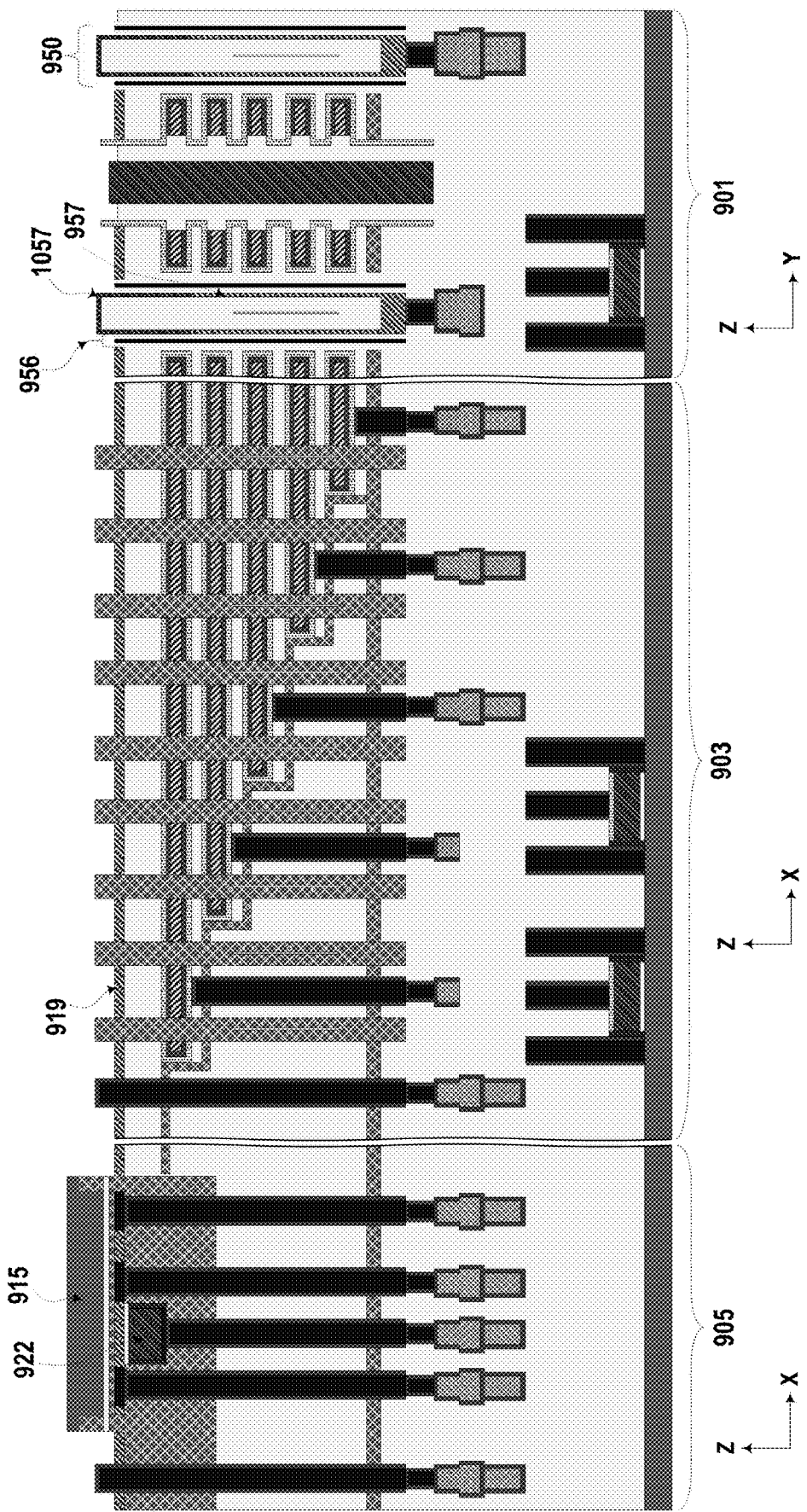

As shown in FIG. 14, in some implementations, the top portion of semiconductor channel 957 can be doped to increase its conductivity to form a doped semiconductor channel region 1057. For example, a tilted ion implantation (IMP) process may be performed to dope the top portion of semiconductor channel 957 (e.g., including polysilicon) with p-type dopants (e.g., boron, indium, gallium, etc.), or n-type dopants (e.g., phosphorus, arsenic, etc.), to a desired doping concentration. For p-type in-situ doping, p-type doping precursors, such as, but not limited to, diborane ($B_2H_6$) and boron trifluoride ($BF_3$), can be used. For n-type in-situ doping, n-type doping precursors, such as, but not limited to, $PH_3$ and $AsH_3$, can be used. In some implementations, after the IMP process, an array thermal treatment can be applied to the top surface of the formed 3D structure to active dopants in both doped semiconductor channel region 1057 and the doped regions of initial semiconductor layer 915 (e.g., wells, sources, and drains of transistors 922) in periphery region 905.

Figure 15:
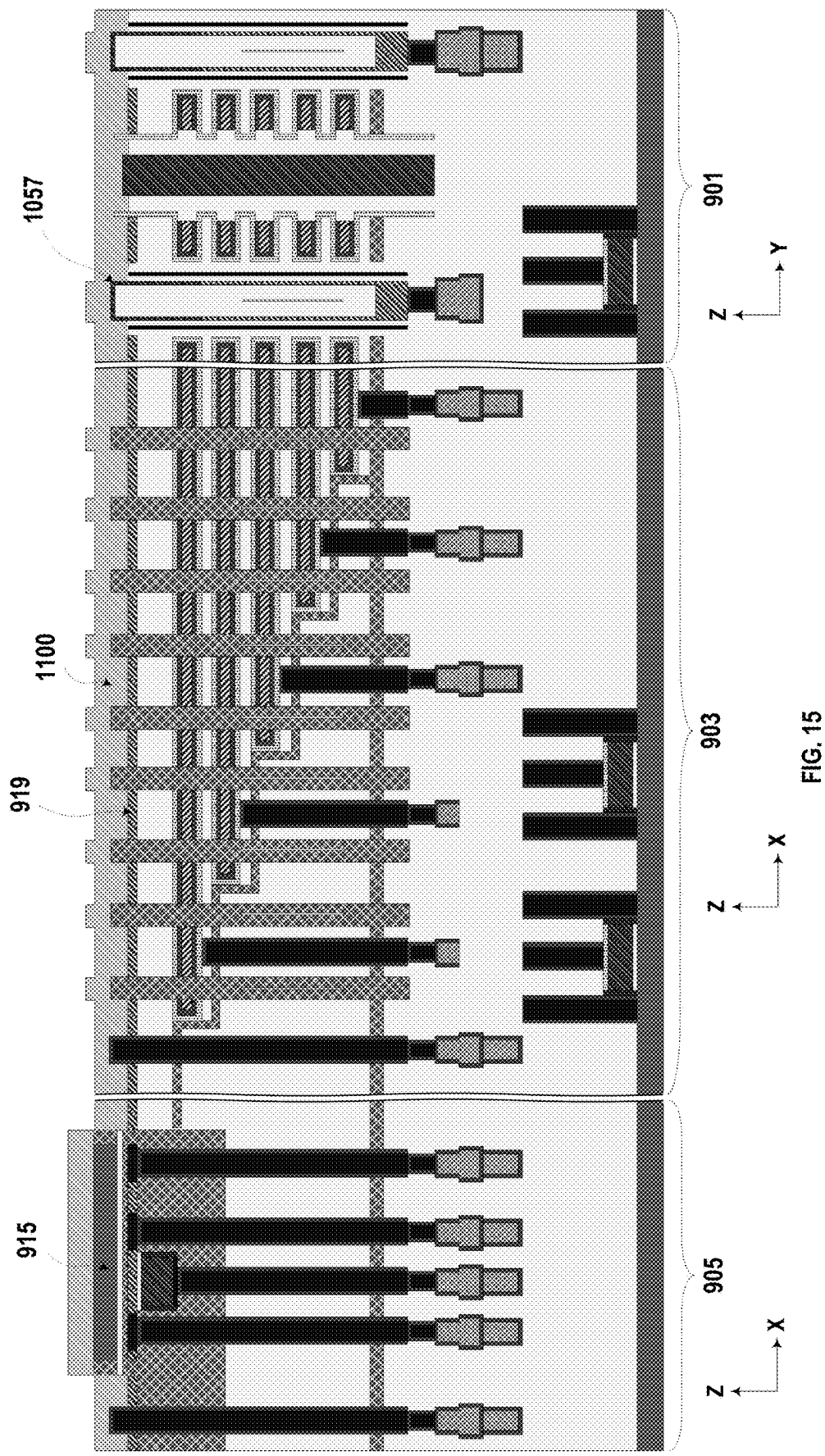
Figure 16:
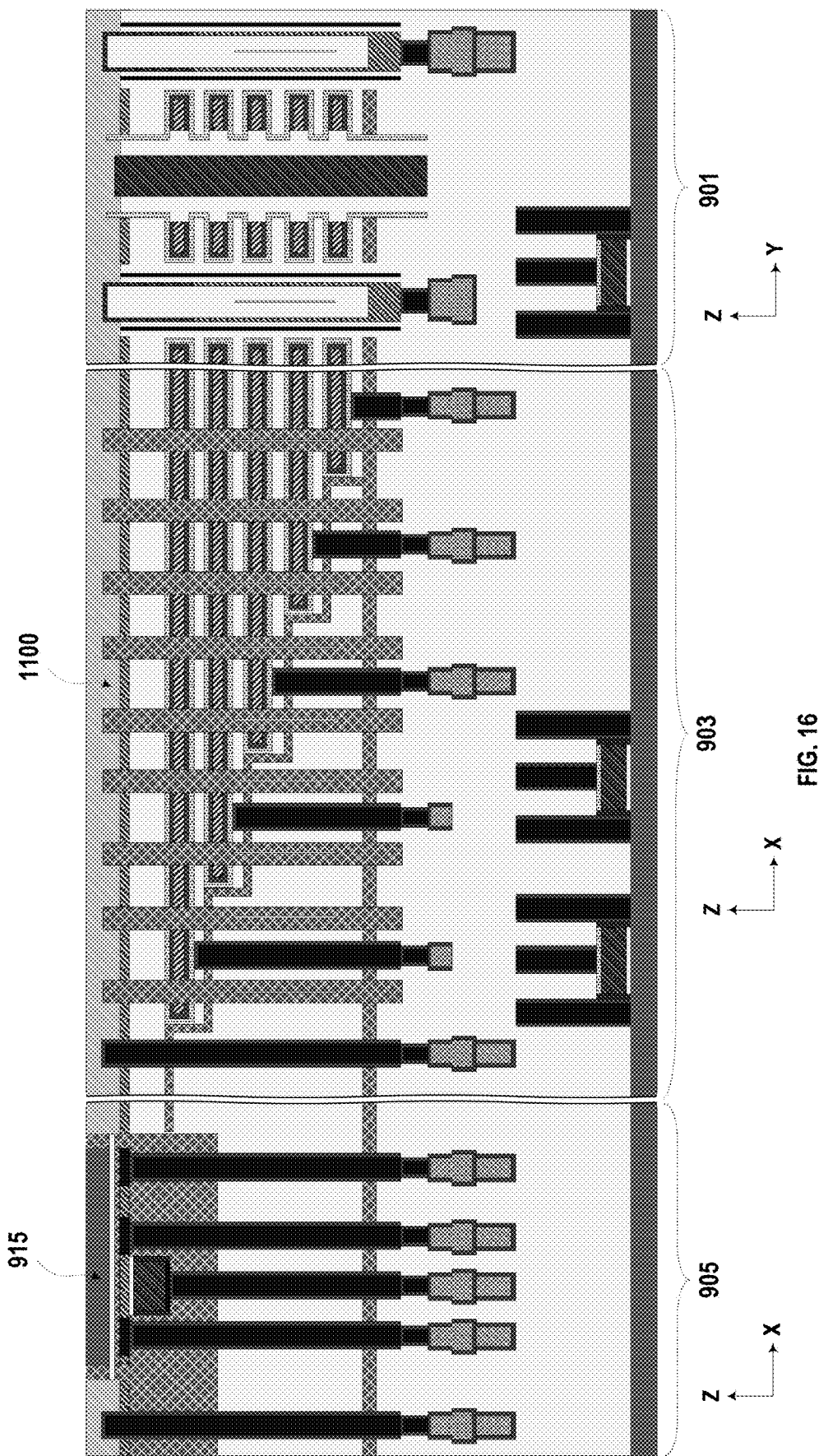

As shown in FIG. 15, supplemental semiconductor layer 1100 can be formed in core region 901, staircase region 903, and periphery region 905. Supplemental semiconductor layer 1100 can be in electrical contact with the doped semiconductor channel region 1057 of each channel structure 950. In some implementations, supplemental semiconductor layer 1100 can be in electrical contact with first substrate 910 in periphery region 905. In some implementations, fabricating processes of supplemental semiconductor layer 1100 can include depositing a doped amorphous silicon layer to cover the top surfaces of the 3D structure as shown in FIG. 15, and a followed chemical mechanical polishing (CMP) process to planarize the top surfaces of the doped amorphous silicon layer as shown in FIG. 16.

Referring back to FIG. 8, method 800 proceeds to operation 809, in which one or more local activation processes can be performed on certain portions of the supplemental semiconductor layer to transform the supplemental semiconductor layer into an activated semiconductor layer. In some implementations, during the one or more local activation processes, amorphous silicon material of the supplemental semiconductor layer can be converted to polycrystalline silicon material.

In some implementations, one or more local activation processes can be applied to portions of supplemental semiconductor layer 1100 in core region 901 to convert the amorphous silicon material to polycrystalline silicon material. A detailed description of local activation process can be referenced to U.S. patent application Ser. No. 17/539,677, filed on Dec. 1, 2021, which is entirely incorporated herein. It is noted that, the one or more local activation processes can be performed in one or more predetermined regions of supplemental semiconductor layer 1100 in core region 901 to locally activate the amorphous silicon material. In some implementations, the activation process may include a local thermal treatment, such as a laser anneal process. In some implementations, the temperature of the local thermal treatment may range from 1300 degrees Celsius to 1700 degrees Celsius. In some implementations, the laser anneal process includes a plurality of laser pulses in a laser beam, each having a pulse time of 100 ns (i.e., nanoseconds) to 300 ns.

Figure 19A:
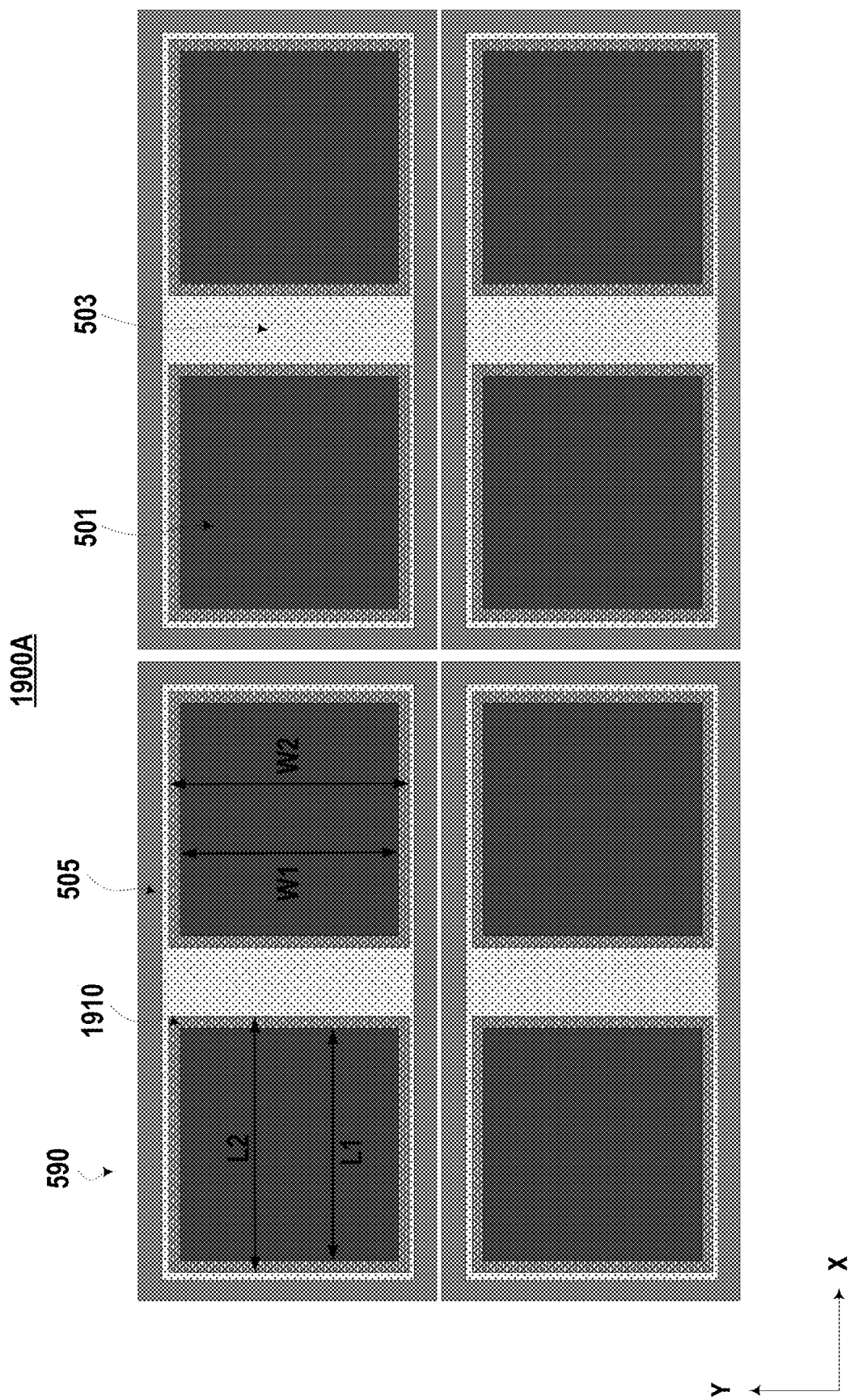
FIGS. 19A-19B illustrate schematic diagrams of exemplary 3D memory dies in a top view, according to various aspects of the present disclosure.
Figure 19B:
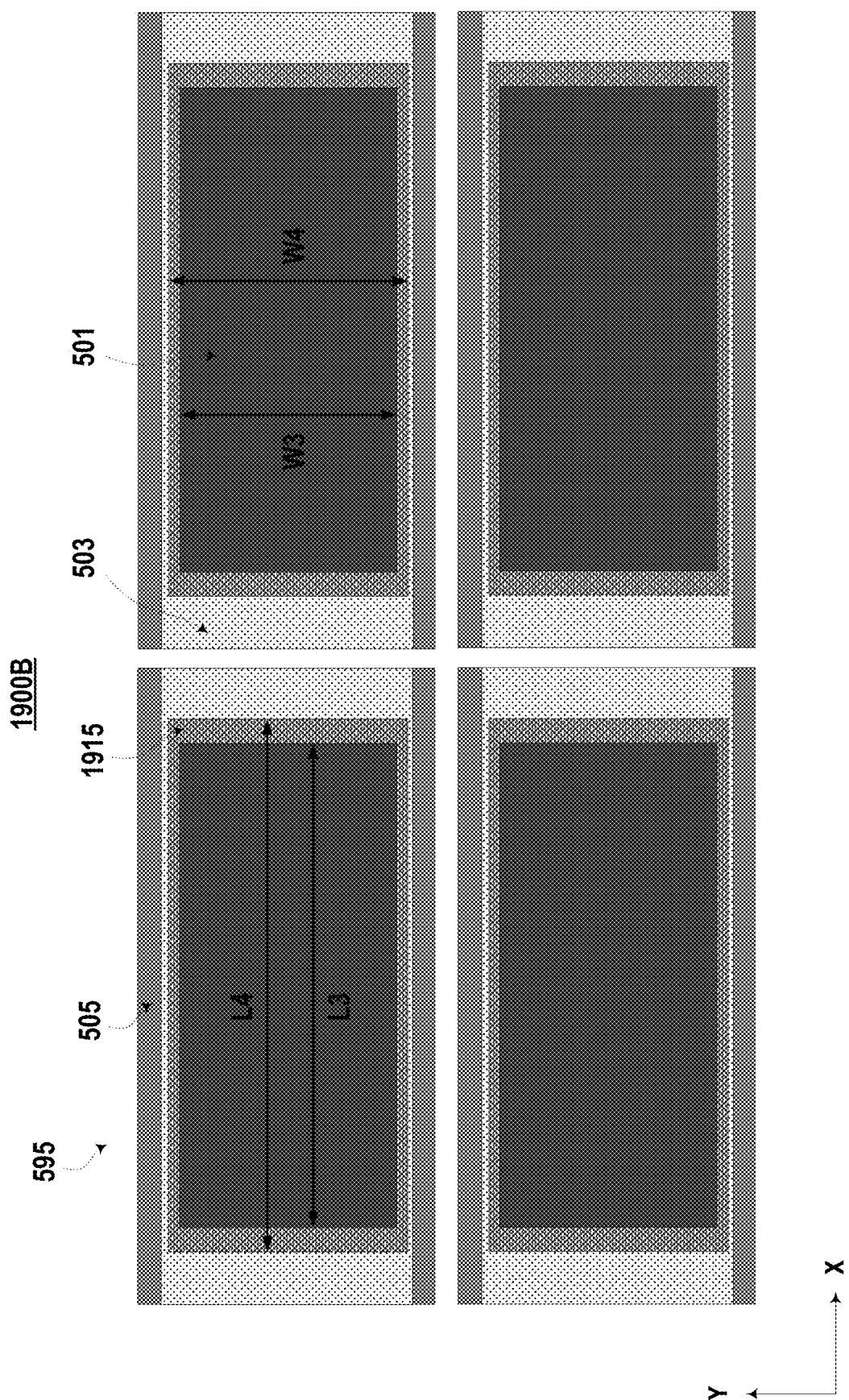

The local thermal treatment may be confined in a desired controlled area, and would not affect other thermal-sensitive structures, such as the doped regions of initial semiconductor layer 915 (e.g., wells, sources, and drains of transistors 922) in periphery region 905, thereby avoiding diffusion of implanted ions in such thermal-sensitive regions. In some implementations, the one or more activation processes may not be applied to most portions of supplemental semiconductor layer 1100 in staircase region 903. For example in memory die 1900A as shown in FIG. 19A, when each memory plane 590 includes two core regions 501 that are separated and surrounded by staircase region 503, two local thermal treatment areas 1910 can be used to cover the two core regions 501. In some implementations as shown in FIG. 19A, when core region 501 has a length L1 in X direction and a width W1 in Y direction, each local thermal treatment area 1910 can have a length L2 larger than L1, and a width W2 larger than W1, to ensure a complete coverage of core region 501. Similarly in some memory die 1900B as shown in FIG. 19B, each memory plane 595 includes one core region 501 having a length L3 in X direction and a width W3 in Y direction, each local thermal treatment area 1915 can have a length L4 larger than L3, and a width W4 larger than W3, to ensure a complete coverage of core region 501.

Figure 17:
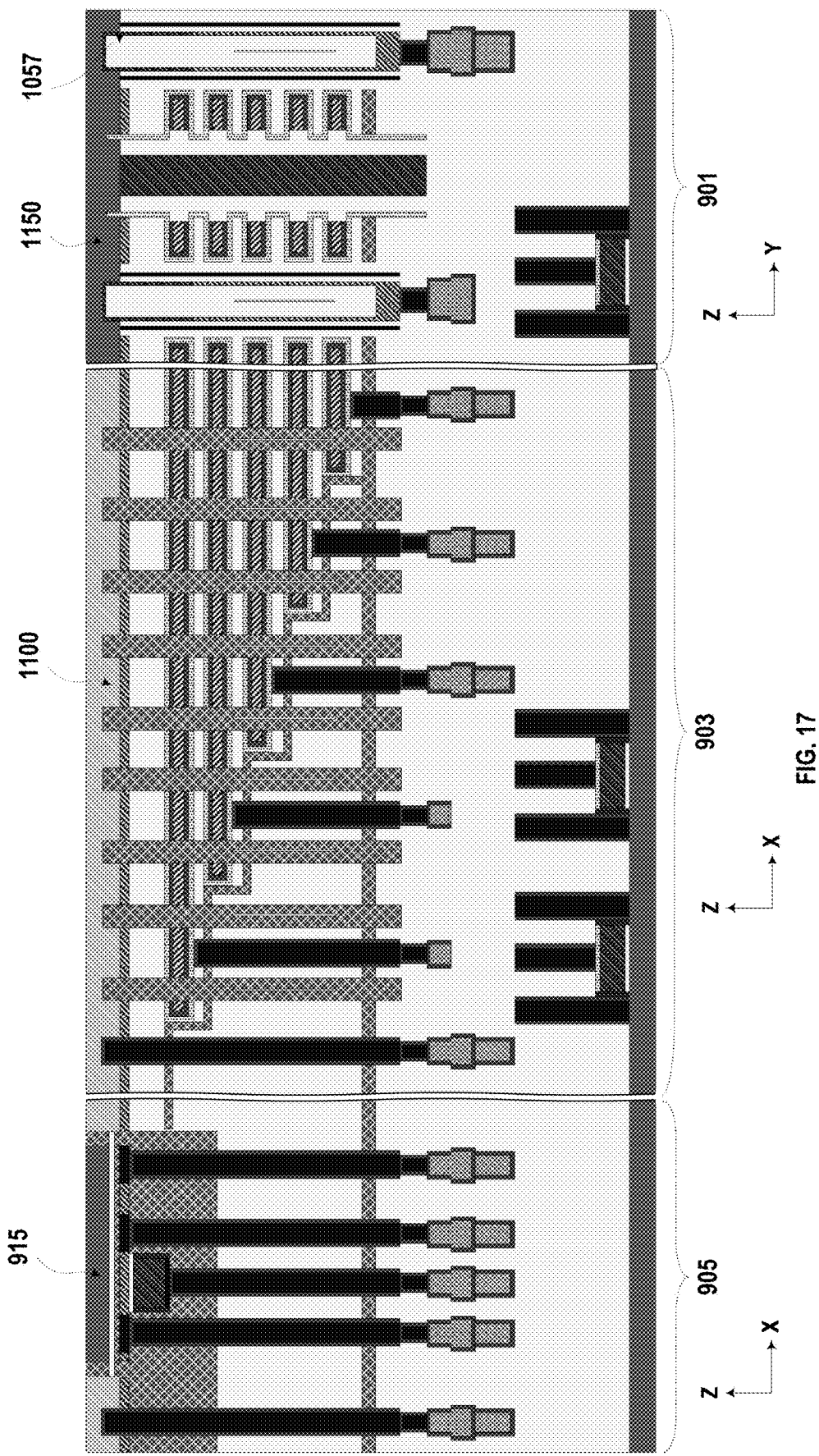

As shown in FIG. 17, after the one or more local activation processes, activated semiconductor layer 1150 (e.g., doped polysilicon layer) can extend at least in core region 901 and in contact with doped semiconductor channel region 1057 of each channel structure 950. The remaining portions of supplemental semiconductor layer 1100 may keep doped amorphous silicon layer in staircase region 903 and parts of periphery region 905. It is noted that, the stress of the amorphous silicon layer can be negative, and the stress of the polycrystalline silicon layer can be positive. Such negative and positive stresses in different regions of first semiconductor 900 can cancel each other out. Therefore, the stress distribution can be controlled to reduce wafer stress by defining regions to be applied by the local thermal treatment. It is noted that, the specific layout of the portions of amorphous silicon layer or polycrystalline silicon layer should not be limited by the implementations of the present disclosure.

Referring back to FIG. 8, method 800 proceeds to operation 811, in which a pad layer can be formed on the supplemental semiconductor to electrically connect with the activated semiconductor layer.

Figure 18:
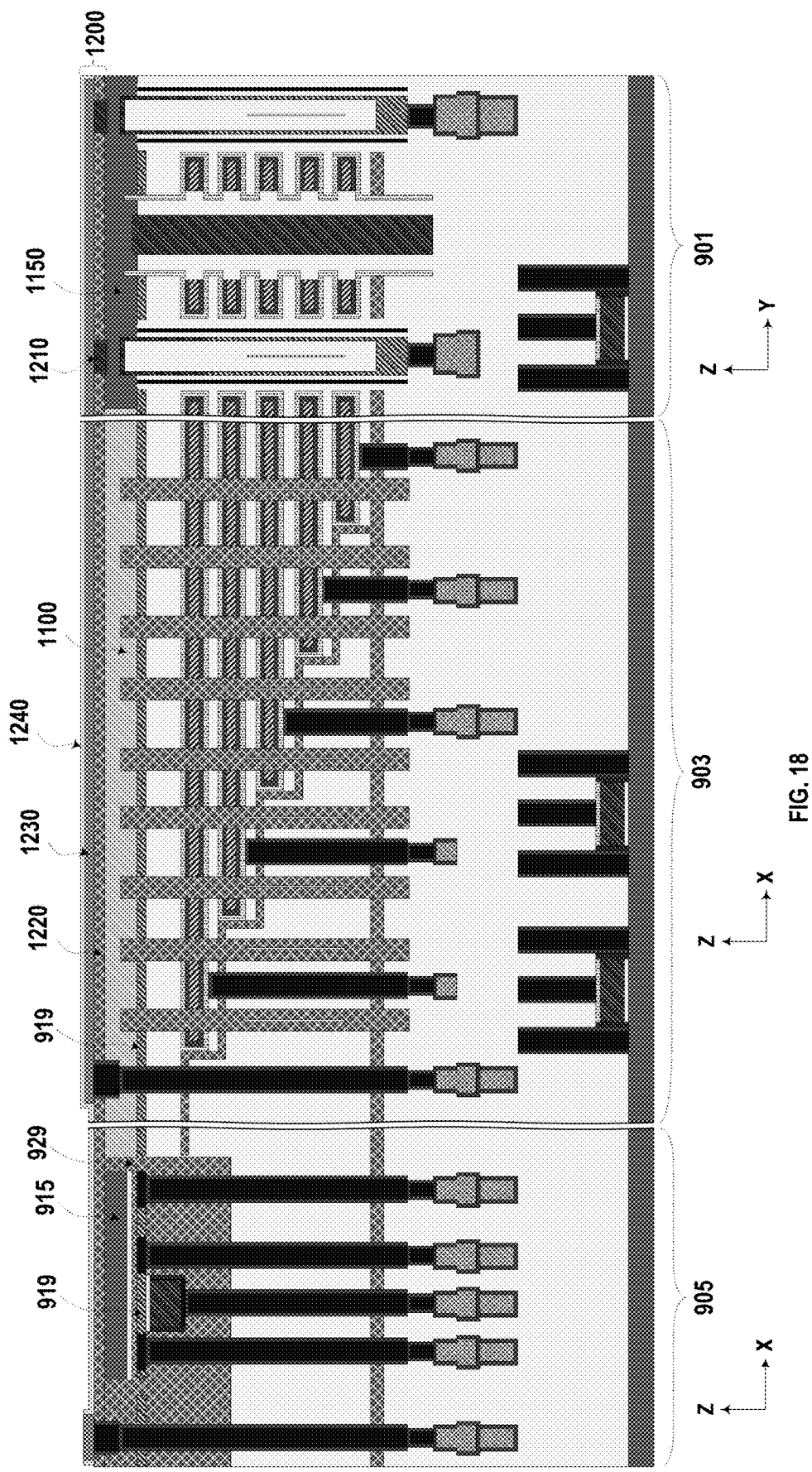

As shown in FIG. 18, pad layer 1200 can include multiple pad structures 1210 embedded in a pad dielectric layer 1220 and in electric connection with activated semiconductor layer 1150. In some implementations, pad layer 1200 can further include wiring layer 1230 in core region 901 and staircase region 903 on pad structures 1210 and pad dielectric layer 1220. In some implementations, pad layer 1200 can further include protection layer 1240 in core region 901 and staircase region 903 on wiring layer 1230, and in periphery region 905 on pad dielectric layer 1220.

Pad dielectric layer 1220 can include one or more layers of dielectric materials such as silicon oxide, silicon nitride, silicon oxynitride, or any combination thereof, and can be formed by one or more thin film deposition processes, such as ALD, CVD, PVD, any other suitable processes, or any combination thereof. In some implementations, pad dielectric layer 1220 can be formed in core region 901, staircase region 903, and periphery region 905 to cover initial semiconductor layer 915, supplemental semiconductor layer 1100, and activated semiconductor layer 1150.

Each pad structure 1210 can be formed in pad dielectric layer 1220, and include one or more contact structures, single-layer/multi-layer vias, conductive lines, plugs, pads, and/or any other suitable conductive structures that are made by conductive materials including, but not limited to, W, Co, Cu, Al, doped silicon, silicides, or any combination thereof. The upper end of each pad structure 1210 can be flush with one another at the top surface of pad dielectric layer 1220, and the lower end of each pad structure 1210 can be in contact with corresponding contact structures and/or activated semiconductor layer 1150.

It is understood that, a contact process for forming the multiple pad structures 1210 can include multiple processes, for example, photolithography, etching, thin film deposition, and CMP. In some implementations, a hard mask layer can be formed on the pad dielectric layer 1220, and multiple vertical through openings can be formed in the pad dielectric layer 1220 by a wet etching and/or dry etching by using the hard mask layer. A followed deposition process can form the multiple pad structures 1210 by filling the multiple vertical through openings with conductor materials using ALD, CVD, PVD, any other suitable processes, or any combination thereof. The conductor materials used for filling the multiple vertical through openings can include, but are not limited to, W, Co, Cu, Al, polysilicon, silicides, or any combination thereof.

Wiring layer 1230 can be a patterned conductive layer formed on pad structures 1210 and pad dielectric layer 1220 in core region 901 and staircase region 903, as shown in FIG. 18. In some implementations, fabricating processes of forming wiring layer 1230 can include forming a conductive layer over pad structures 1210 and pad dielectric layer 1220. After that, a resist mask is formed by a photolithography process, and an unnecessary portion is removed by etching to form wirings. In some implementations, the resist mask used for forming the wiring layer 1230 can be formed with an ink-jet method. Wiring layer 1230 can be formed with a single-layer structure or a layered structure using any of metal materials such as molybdenum (Mo), titanium (Ti), chromium (Cr), tantalum (Ta), tungsten (W), aluminum (Al), copper (Cu), neodymium (Nd), scandium (Sc), etc., and an alloy material including any of these materials as a main component.

In some implementations, protection layer 1240 can be formed to cover wiring layer 1230 in core region 901 and staircase region 903, and cover pad dielectric layer 1220 in periphery region 905. Protection layer 1240 can include an insulating sublayer and a polymer sublayer. The insulating sublayer can be a nitride layer, such as a metal nitride layer. The polymer sublayer can be any suitable nanoconfinement of polymers configured to prevent scratching of or damage to wiring layer 1230.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A three-dimensional (3D) memory device, comprising:
a first semiconductor structure including a core region, a staircase region, and a periphery region, comprising:
  a memory stack on an activated semiconductor layer in the core region,
  a staircase structure on a supplemental semiconductor layer in the staircase region, and
  a first periphery circuit on an initial semiconductor layer in the periphery region; and
a second semiconductor structure including a second periphery circuit on a substrate;
wherein the second semiconductor structure is connected with the first semiconductor structure, and the first periphery circuit is located between the second periphery circuit and a lateral plane in which a surface of the supplemental semiconductor layer is located;
wherein the initial semiconductor layer, the activated semiconductor layer and the supplemental semiconductor layer are substantially coplanar in a lateral plane.

2. The 3D memory device of claim 1, wherein the first semiconductor structure further comprises:
a plurality of channel structures penetrating the memory stack in the core region, each channel structure including a functional layer and a semiconductor channel.

3. The 3D memory device of claim 2, wherein the first semiconductor structure further comprises:
a plurality of dummy channel structures penetrating the staircase structure in the staircase region; and
at least one slit structure vertically penetrating the memory stack and extending in a lateral direction to separate the plurality of channel structures.

4. The 3D memory device of claim 3, wherein the memory stack comprises:
a plurality of interleaved stack dielectric layers and stack gate structures stacked in a vertical direction.

5. The 3D memory device of claim 4, wherein the first semiconductor structure further comprises:
a plurality of contact structures including a plurality of channel structure contact structures in the core region, a plurality of word line contact structures in the staircase region, and a plurality of periphery contact structures in the periphery region; and
a plurality of first interconnect contact structures connected with corresponding contact structures, respectively.

6. The 3D memory device of claim 5, wherein the first periphery circuit comprises:
a high voltage circuit including a plurality of high voltage transistors on the initial semiconductor layer in the periphery region.

7. The 3D memory device of claim 6, wherein the first periphery circuit further comprises:
a low voltage circuit including a plurality of low voltage transistors on the initial semiconductor layer in the periphery region.

8. The 3D memory device of claim 6, wherein the second periphery circuit comprises:
a low low voltage circuit including a plurality of low low voltage transistors on the substrate; and
a plurality of second interconnect contact structures connected with corresponding low low voltage transistors, respectively.

9. The 3D memory device of claim 8, wherein the second periphery circuit further comprises:
a low voltage circuit including a plurality of low voltage transistors on the substrate.

10. The 3D memory device of claim 8, wherein:
the second semiconductor structure and the first semiconductor structure are connected in a face-to-face manner, such that the first interconnect contact structures and corresponding second interconnect contact structures are connected respectively at a bonding interface.

11. The 3D memory device of claim 6, wherein the first semiconductor structure further comprises:
a semiconductor film on the activated semiconductor layer, the supplemental semiconductor layer, and the initial semiconductor layer and including single crystalline silicon; and
the activated semiconductor layer comprises doped polycrystalline silicon.

12. The 3D memory device of claim 11, wherein:
the plurality of channel structures and the plurality of dummy channel structures penetrate through the semiconductor film; and
the high voltage transistors are formed partially in the semiconductor film.

13. The 3D memory device of claim 11, wherein the first semiconductor structure further comprises:
a spacer structure configured to separate a first portion of the semiconductor film in the periphery region and a second portion of the semiconductor film in the staircase region and the core region.

14. The 3D memory device of claim 2, wherein:
the functional layer of each channel structure comprises a blocking layer, a storage layer, and a tunneling layer; and
the semiconductor channel comprises a doped semiconductor channel region contacting the activated semiconductor layer.

15. The 3D memory device of claim 1, wherein the first semiconductor structure further comprises a pad layer on the activated semiconductor layer and the supplemental semiconductor layer.

16. The 3D memory device of claim 15, wherein the pad layer comprises:
a pad dielectric layer on the activated semiconductor layer, the supplemental semiconductor layer, and the initial semiconductor layer;
a plurality of pad structures embedded in the pad dielectric layer;
a wiring layer on the pad dielectric layer in the activated semiconductor layer and the supplemental semiconductor layer to connect with the plurality of pad structures; and
a protection layer to cover the wiring layer.

17. A memory system, comprising:
a memory device configured to store data, and comprising:
   a first semiconductor structure including a core region, a staircase region, and a periphery region, comprising:
      a memory stack including an array of memory cells on an activated semiconductor layer in the core region,
      a staircase structure on a supplemental semiconductor layer in the staircase region, and
      a first periphery circuit on an initial semiconductor layer in the periphery region;
   a second semiconductor structure including a second periphery circuit on a substrate, wherein the second semiconductor structure is connected with the first semiconductor structure, and the first periphery circuit is located between the second periphery circuit and a lateral plane in which a surface of the supplemental semiconductor layer is located, wherein the initial semiconductor layer, the activated semiconductor layer and the supplemental semiconductor layer are substantially coplanar in a lateral plane; and
a memory controller coupled to the memory device and configured to control the array of memory cells through the first peripheral circuit and the second periphery circuit.

18. The memory system of claim 17, wherein:
the first periphery circuit comprises a high voltage circuit including a plurality of high voltage transistors on the initial semiconductor layer in the periphery region;
the second periphery circuit comprises a low low voltage circuit including a plurality of low low voltage transistors on the substrate; and
the first periphery circuit or the second periphery circuit further comprises a low voltage circuit including a plurality of low voltage transistors on the initial semiconductor layer in the periphery region.

19. The memory system of claim 18, wherein the first semiconductor structure further comprises:
a semiconductor film on the activated semiconductor layer, the supplemental semiconductor layer, and the initial semiconductor layer and including single crystalline silicon; and
the activated semiconductor layer comprises doped polycrystalline silicon.

20. The memory system of claim 19, wherein:
a plurality of channel structures and a plurality of dummy channel structures penetrate through the semiconductor film; and
the high voltage transistors are formed partially in the semiconductor film.

* * * * *